(12) United States Patent
Kamata et al.

(10) Patent No.: US 9,171,631 B2
(45) Date of Patent: Oct. 27, 2015

(54) SEMICONDUCTOR MEMORY DEVICE AND METHOD FOR CONTROLLING THE SAME

(71) Applicant: KABUSHIKI KAISHA TOSHIBA, Minato-ku, Tokyo (JP)

(72) Inventors: Yoshihiko Kamata, Yokohama (JP); Yuko Yokota, Kamakura (JP); Koji Tabata, Yokohama (JP); Tomoyuki Hamano, Yokohama (JP); Mario Sako, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 340 days.

(21) Appl. No.: 13/843,321

(22) Filed: Mar. 15, 2013

(65) Prior Publication Data

US 2013/0279255 A1  Oct. 24, 2013

(30) Foreign Application Priority Data

Apr. 23, 2012  (JP) ................................ 2012-097806
Apr. 23, 2012  (JP) ................................ 2012-097925
Apr. 27, 2012  (JP) ................................ 2012-104083

(51) Int. Cl.
| G11C 16/04 | (2006.01) |
| G11C 16/26 | (2006.01) |
| G11C 16/24 | (2006.01) |
| G11C 16/30 | (2006.01) |

(52) U.S. Cl.
CPC ............ *G11C 16/26* (2013.01); *G11C 16/0483* (2013.01); *G11C 16/24* (2013.01); *G11C 16/30* (2013.01)

(58) Field of Classification Search
CPC .... G11C 16/26; G11C 16/0483; G11C 16/10; H01L 27/115
USPC .................................... 365/185, 185.17, 148
See application file for complete search history.

(56) References Cited

U.S. PATENT DOCUMENTS

| 2004/0057285 | A1 | 3/2004 | Cernea et al. |
| 2006/0023553 | A1 | 2/2006 | Takeyama et al. |
| 2009/0040835 | A1 | 2/2009 | Ogawa |
| 2009/0244978 | A1 | 10/2009 | Yoshihara et al. |
| 2011/0096588 | A1* | 4/2011 | Fasoli ........................... 365/148 |

FOREIGN PATENT DOCUMENTS

| JP | 10-228792 A | 8/1998 |
| JP | 2006032577 A | 2/2006 |
| JP | 2009230827 A | 10/2009 |

OTHER PUBLICATIONS

Japanese Office Action (and English translation thereof) dated May 26, 2015, issued in counterpart Japanese Application No. 2012-104083.

* cited by examiner

*Primary Examiner* — Jason Lappas
(74) *Attorney, Agent, or Firm* — Holtz, Holtz, Goodman & Chick PC

(57) ABSTRACT

According to one embodiment, a semiconductor memory device includes a first transistor, a detector, and a second transistor. The first transistor is capable of transferring a first voltage to a bit line. The detector reads data held by a memory cell connected to the bit line. The second transistor is capable of transferring a second voltage and a third voltage to the detector. The second voltage is generated by a source different from a source of the first voltage. The third voltage is larger than the second voltage. The second transistor charges the detector to one of the second voltage and the third voltage, while the first transistor transferring the first voltage to the bit line.

14 Claims, 26 Drawing Sheets

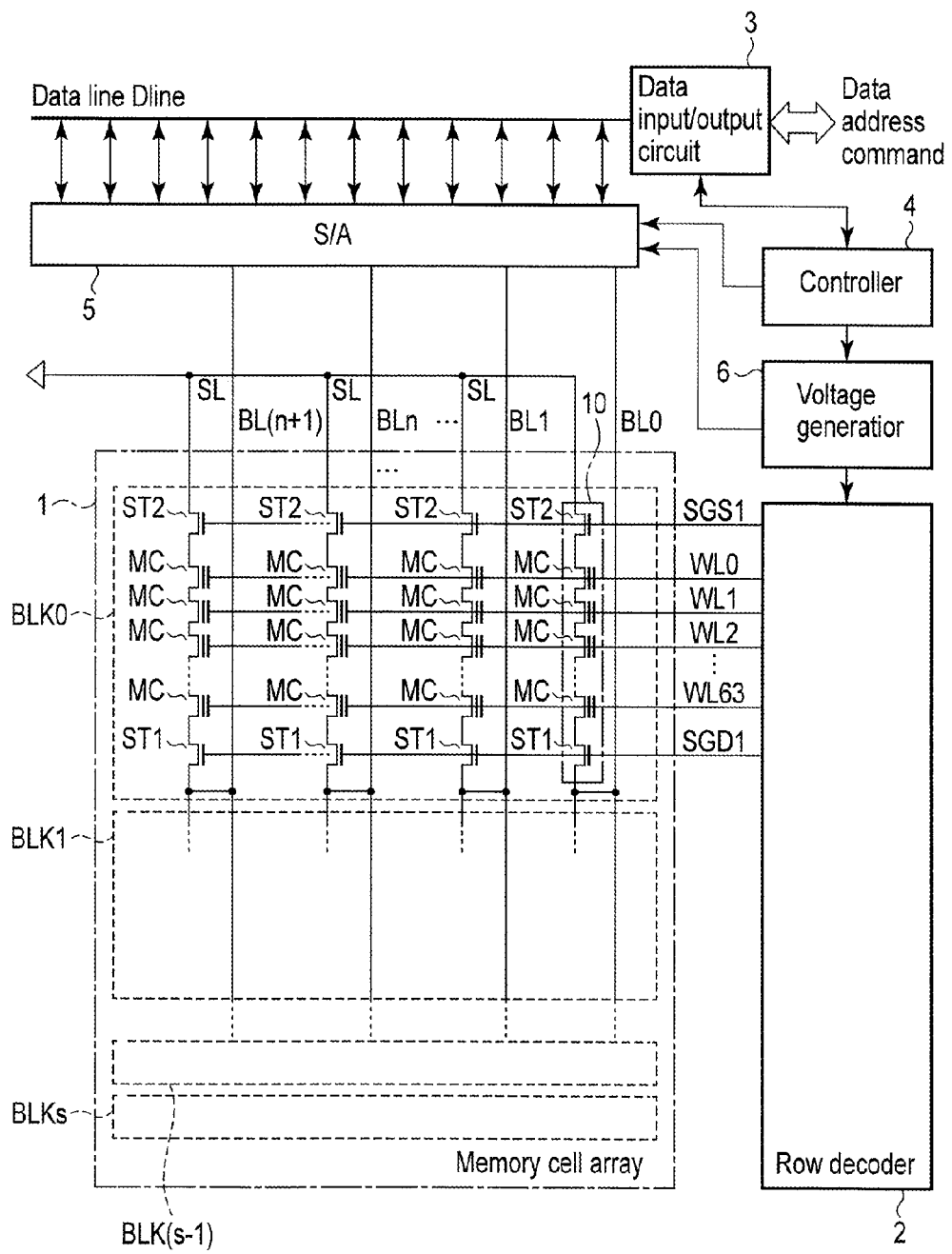
F I G. 1

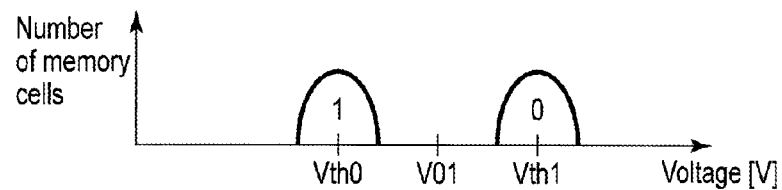
F I G. 2
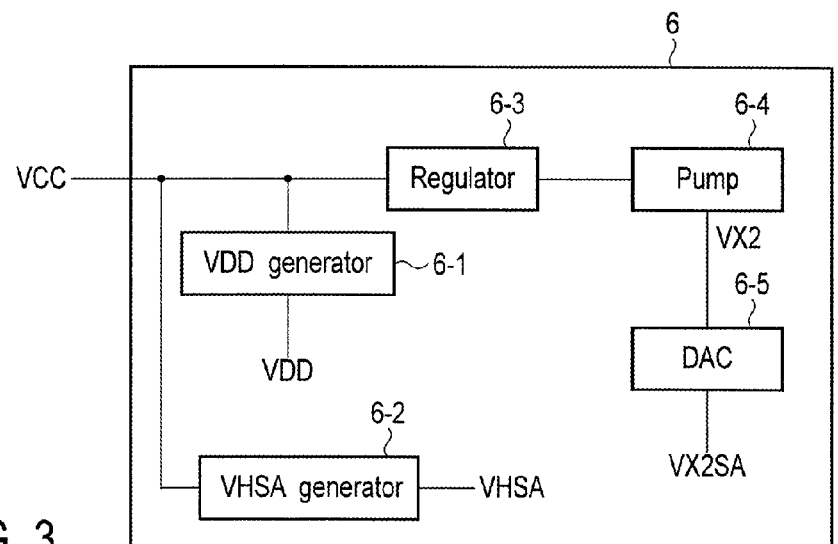
F I G. 3
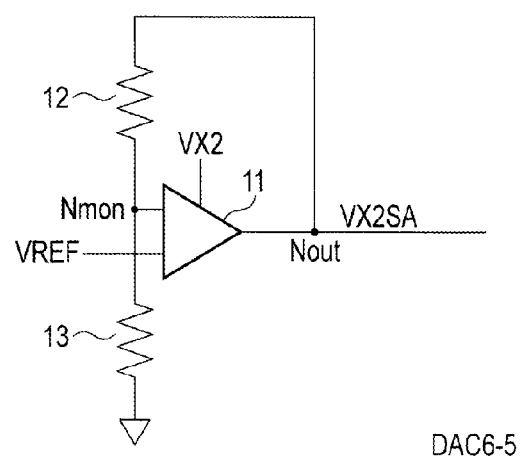
F I G. 4

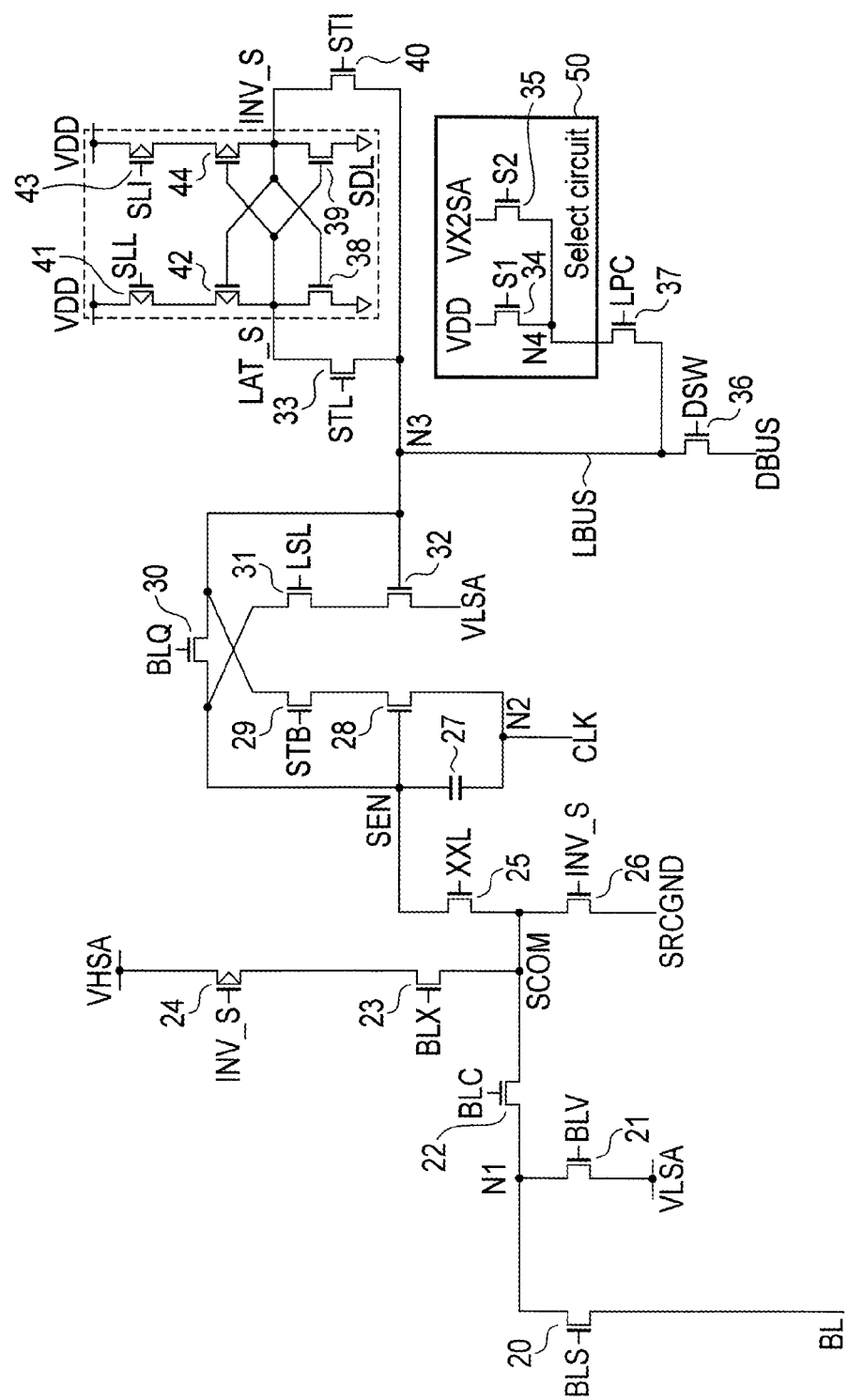
F I G. 5

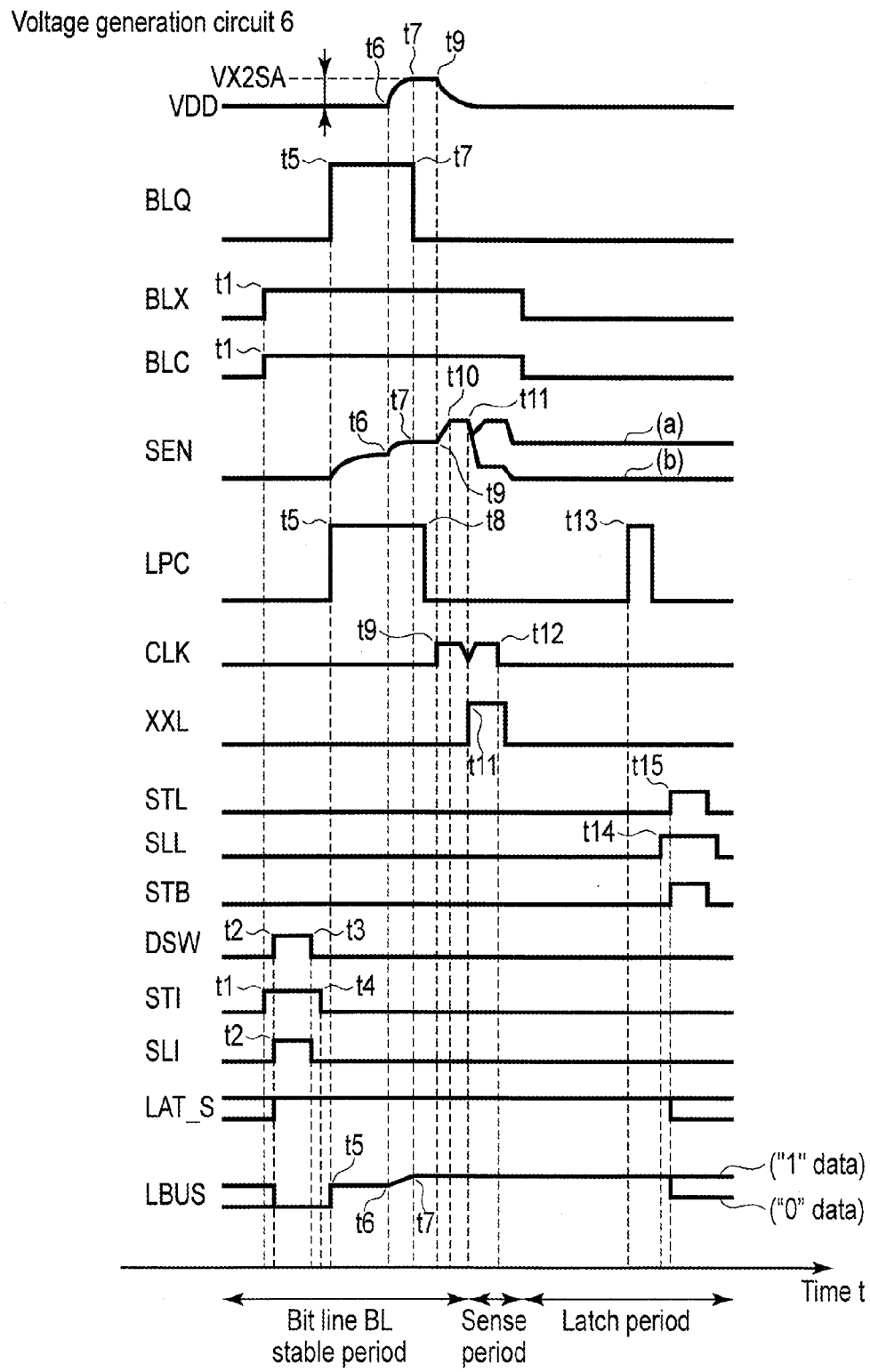
F I G. 7

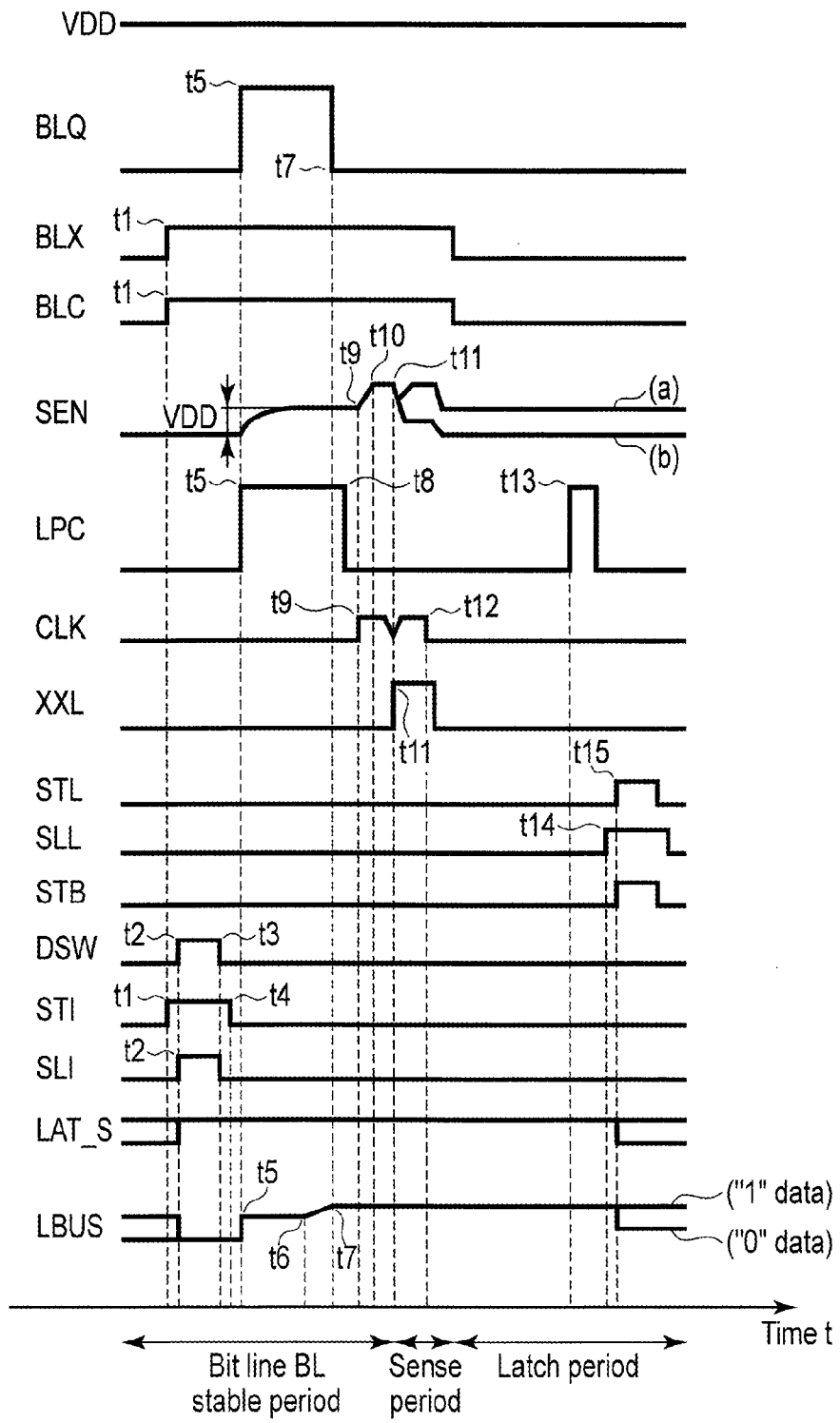
F I G. 10

"0" data write

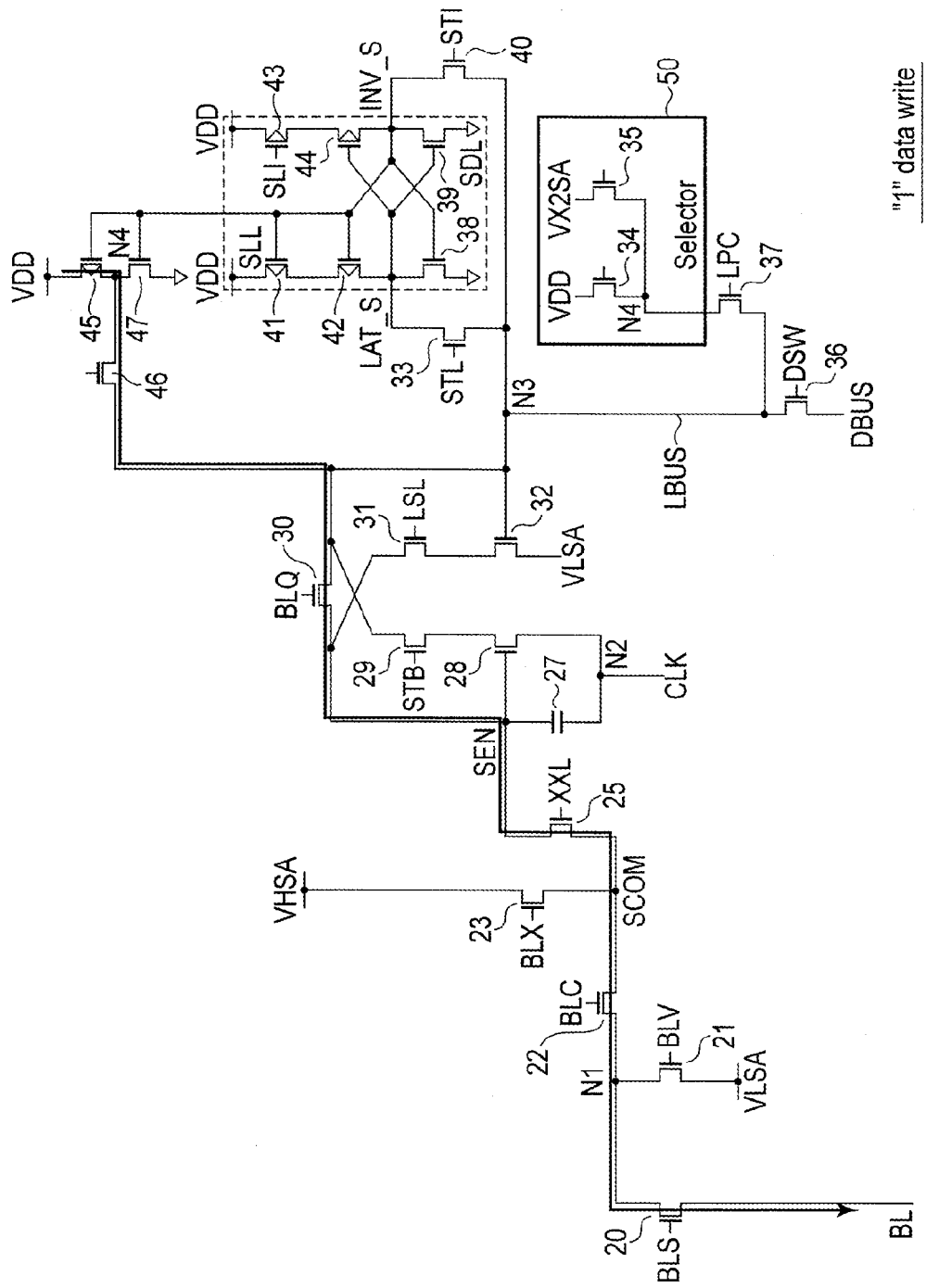
F I G. 13

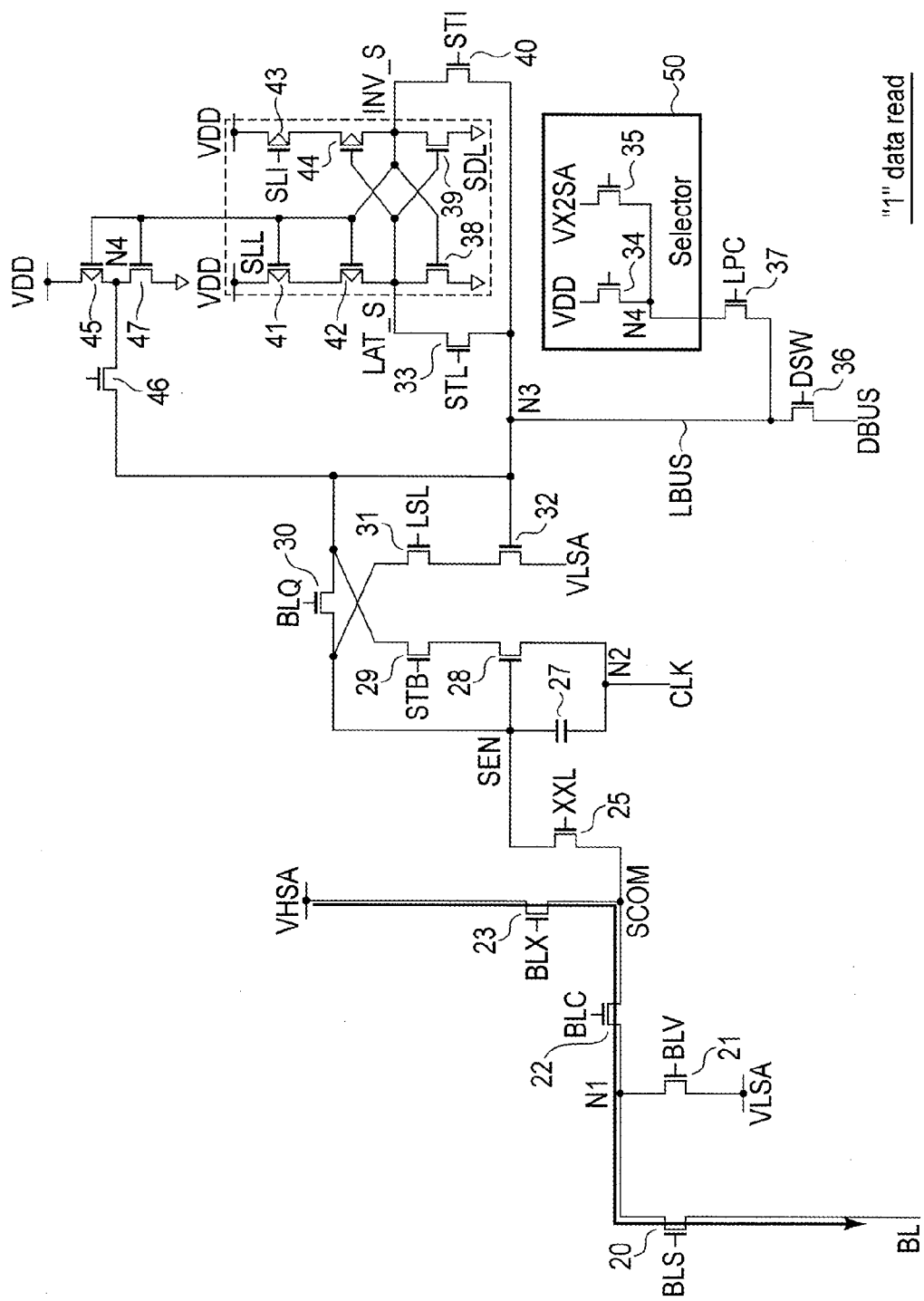
F I G. 14

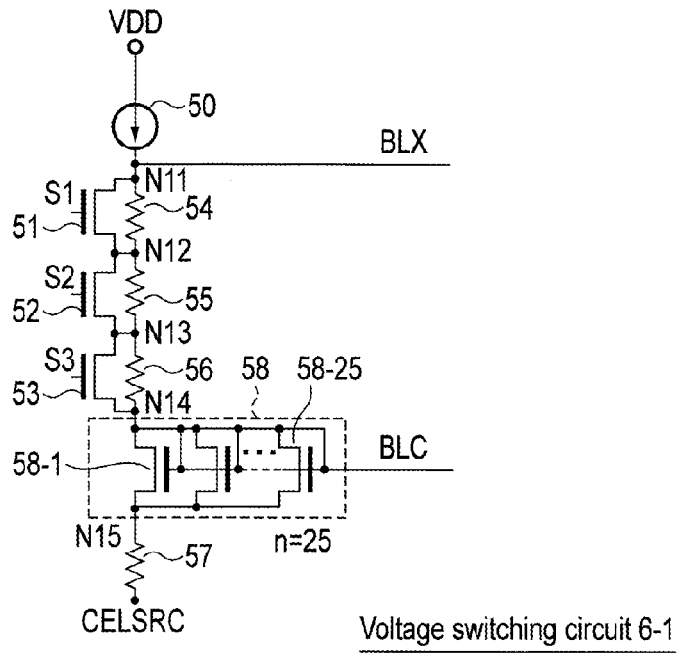
F I G. 15
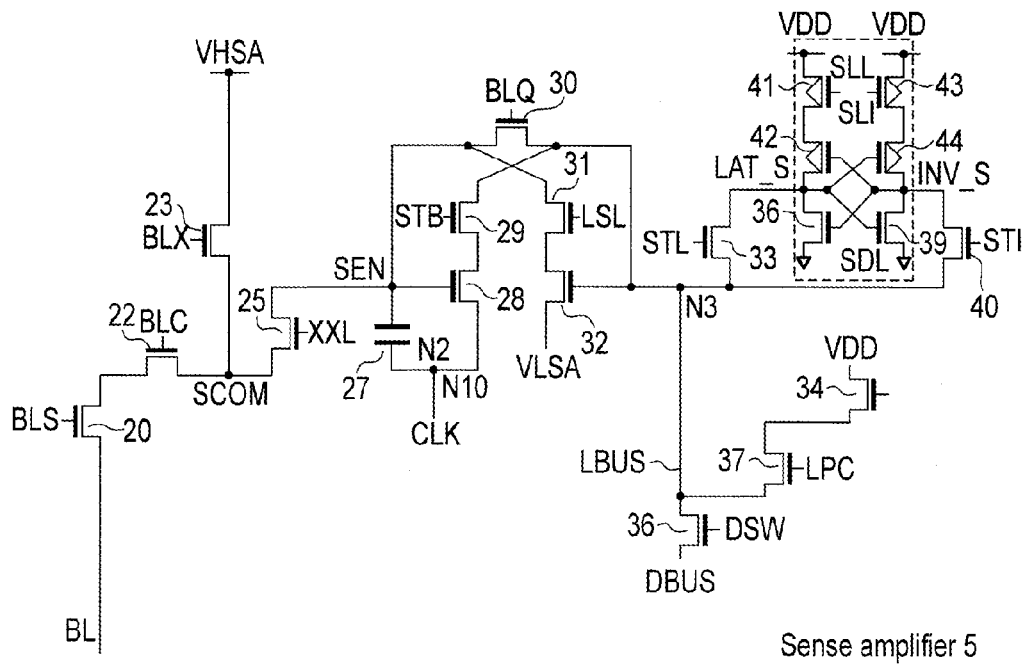
F I G. 16

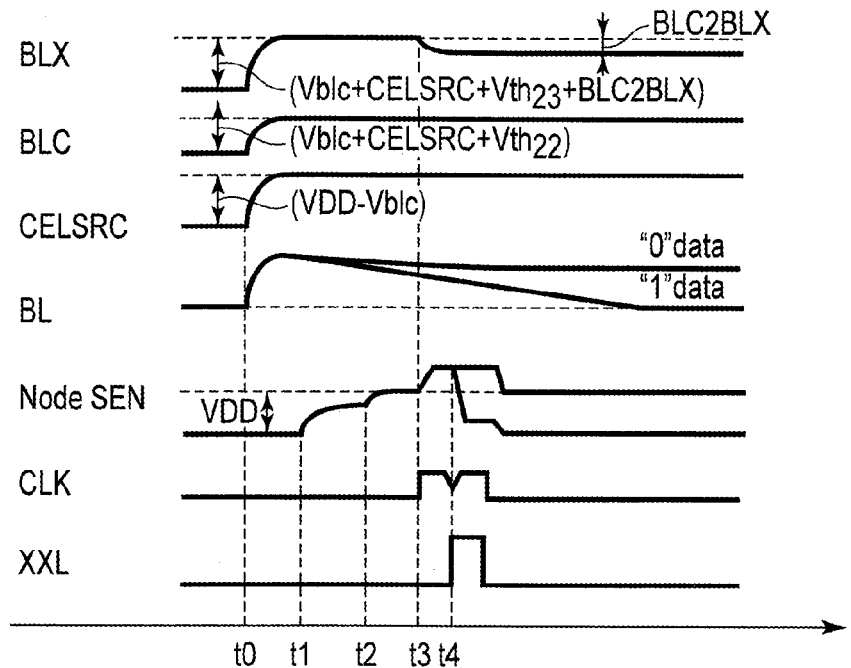
F I G. 21
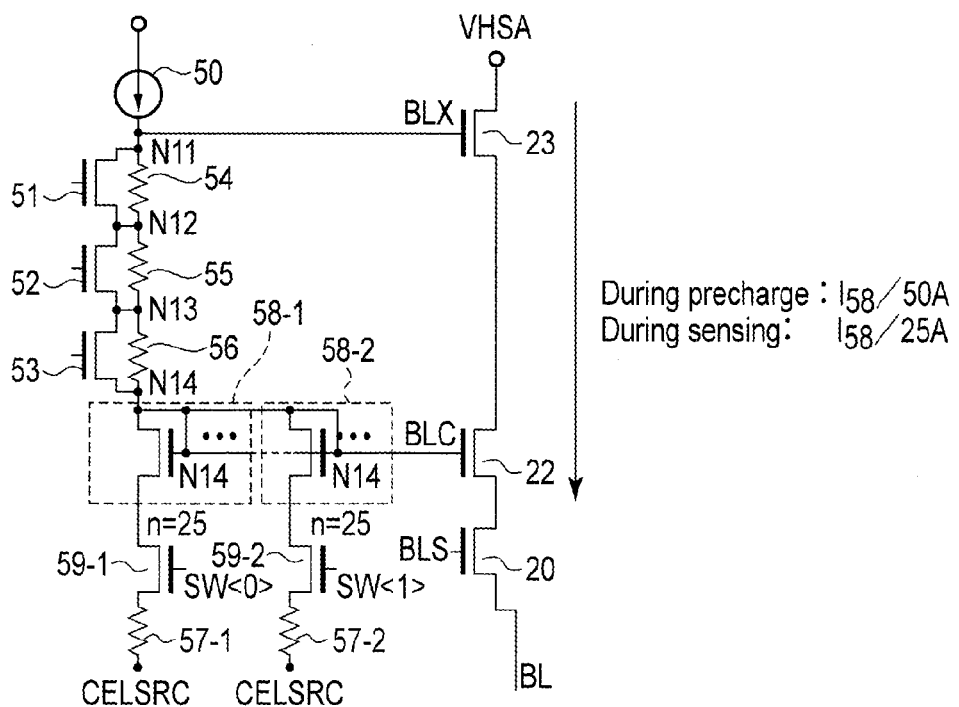
F I G. 22

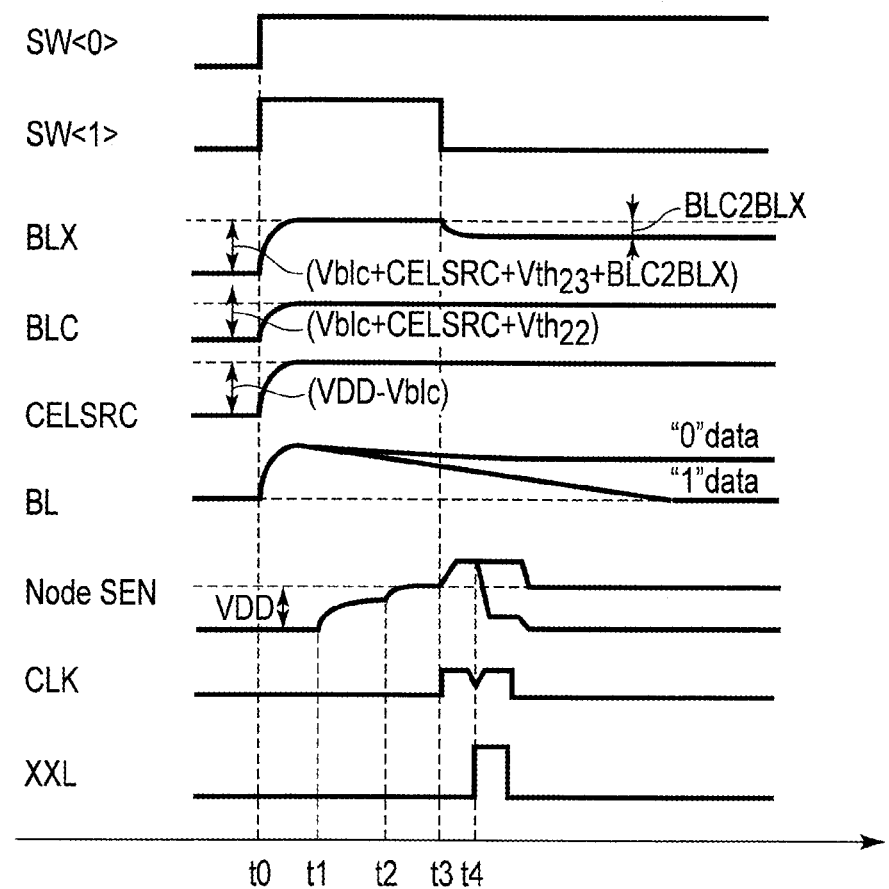
F I G. 23

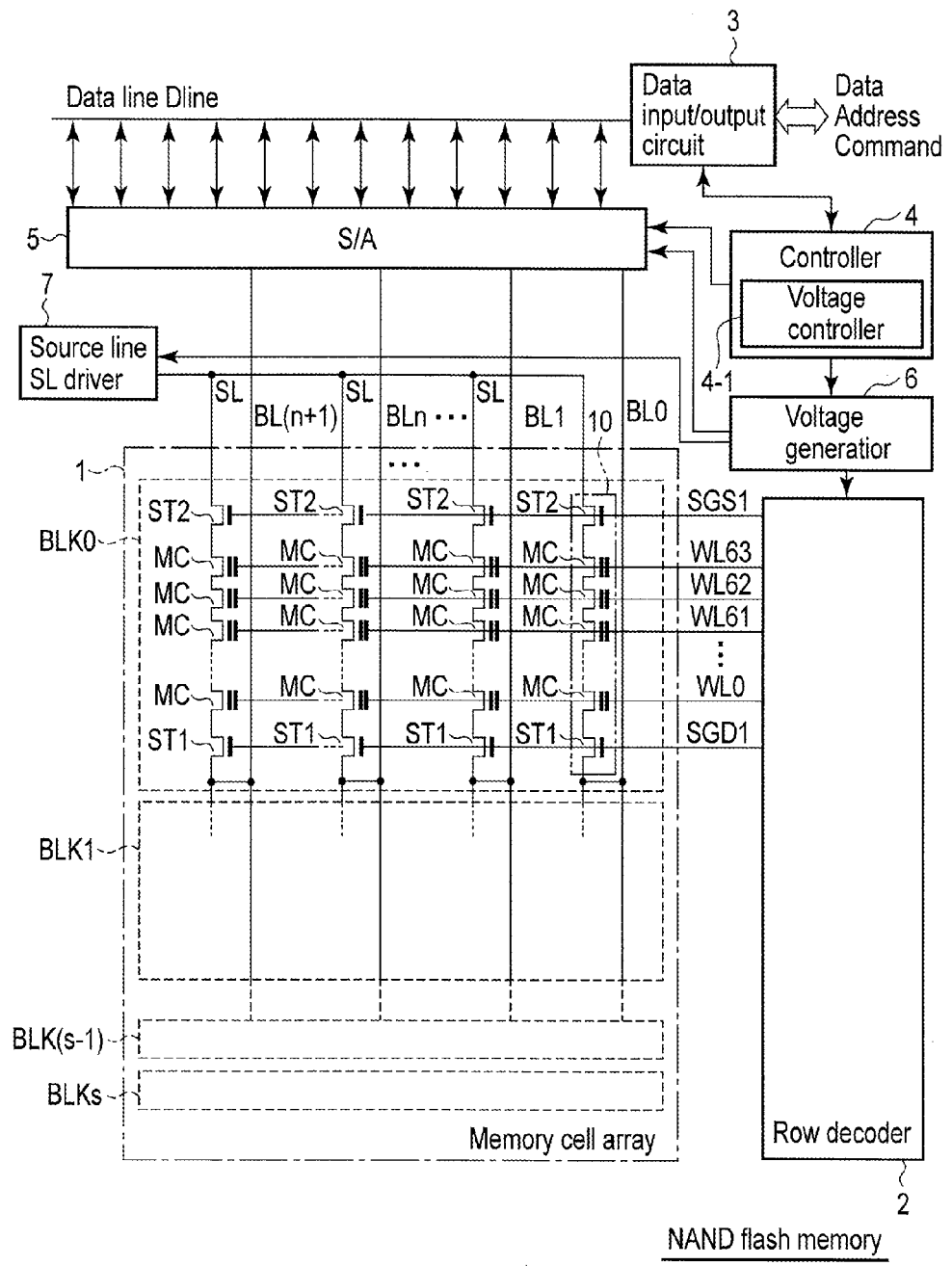
F I G. 24

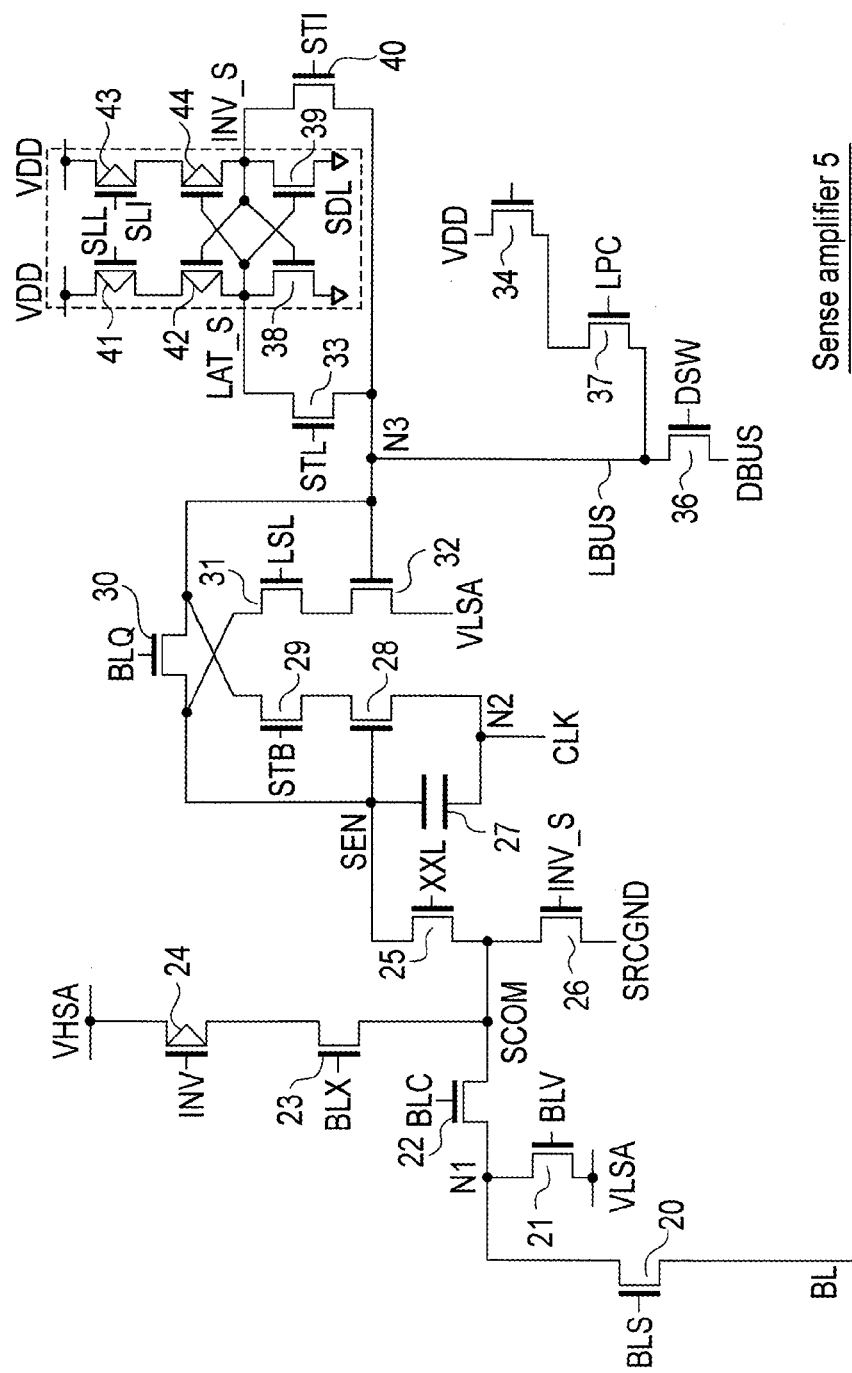
F I G. 25

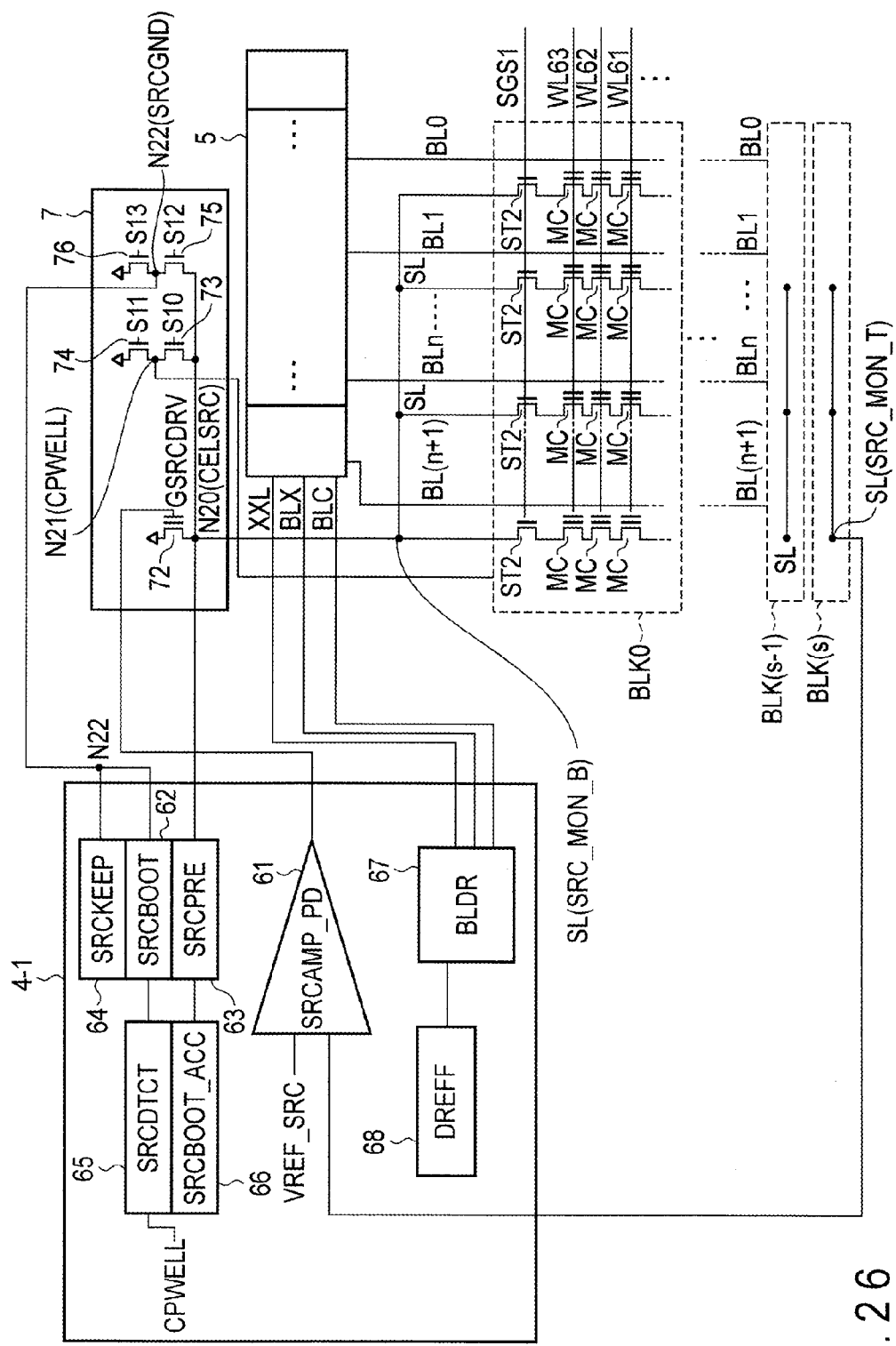
F I G. 26

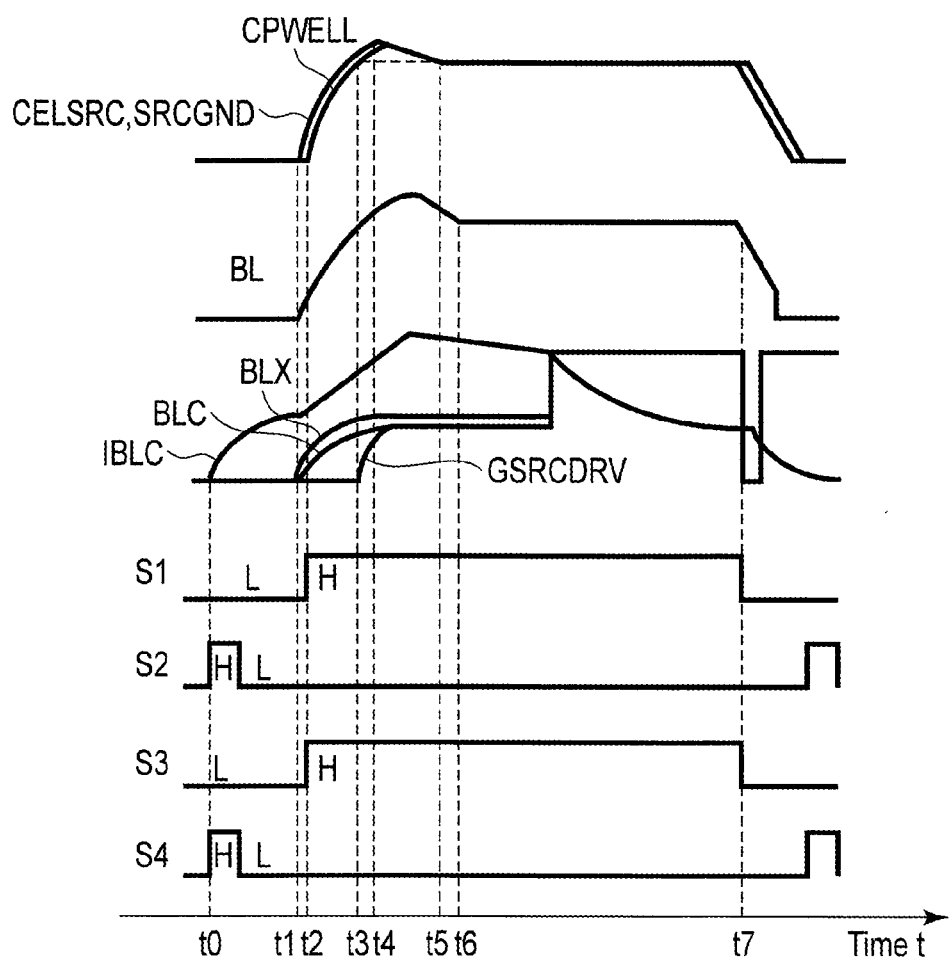
F I G. 27

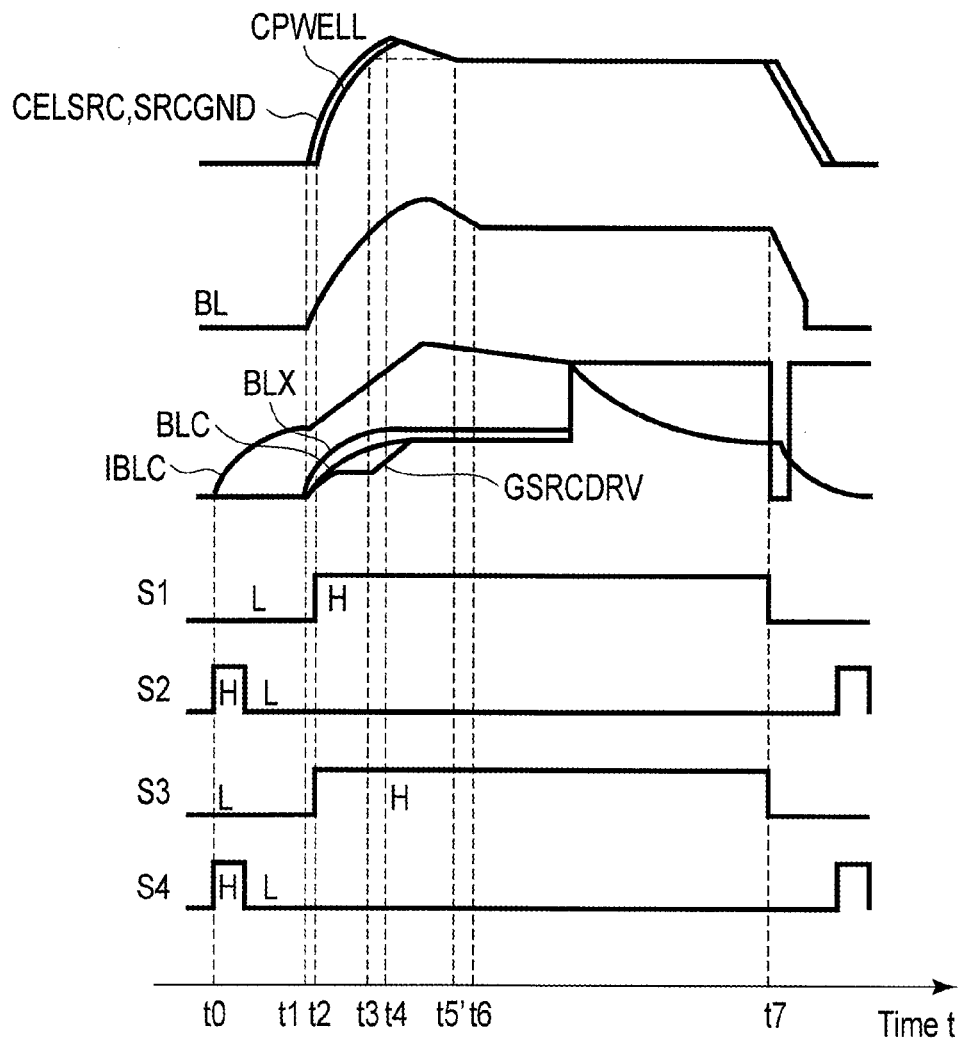
F I G. 29

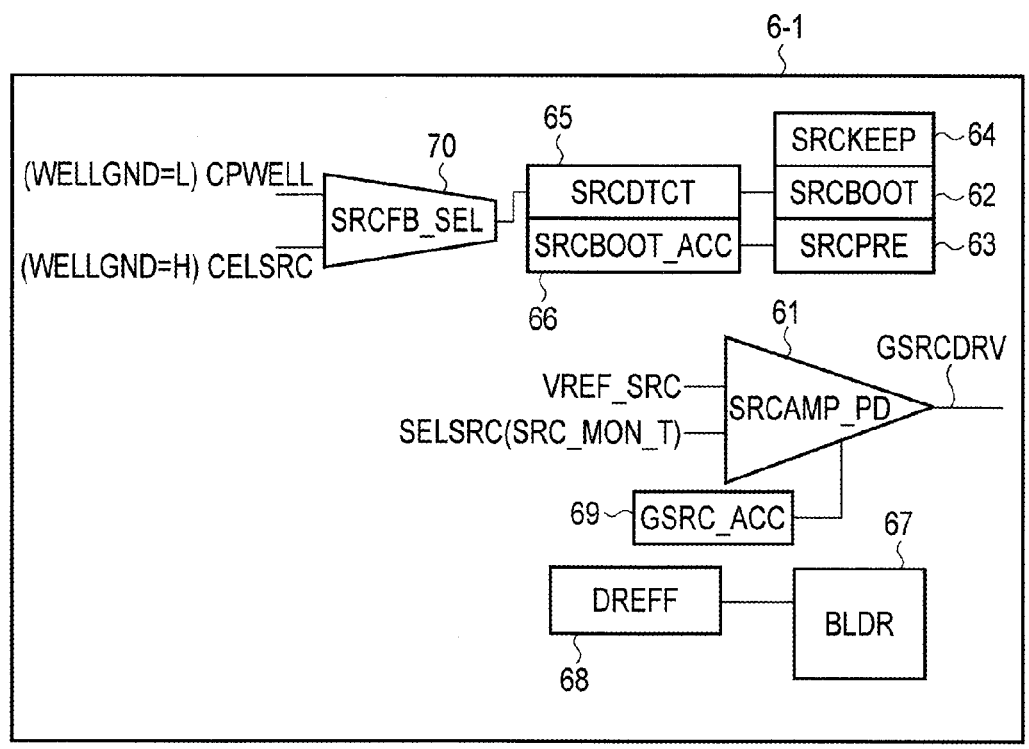
F I G. 30

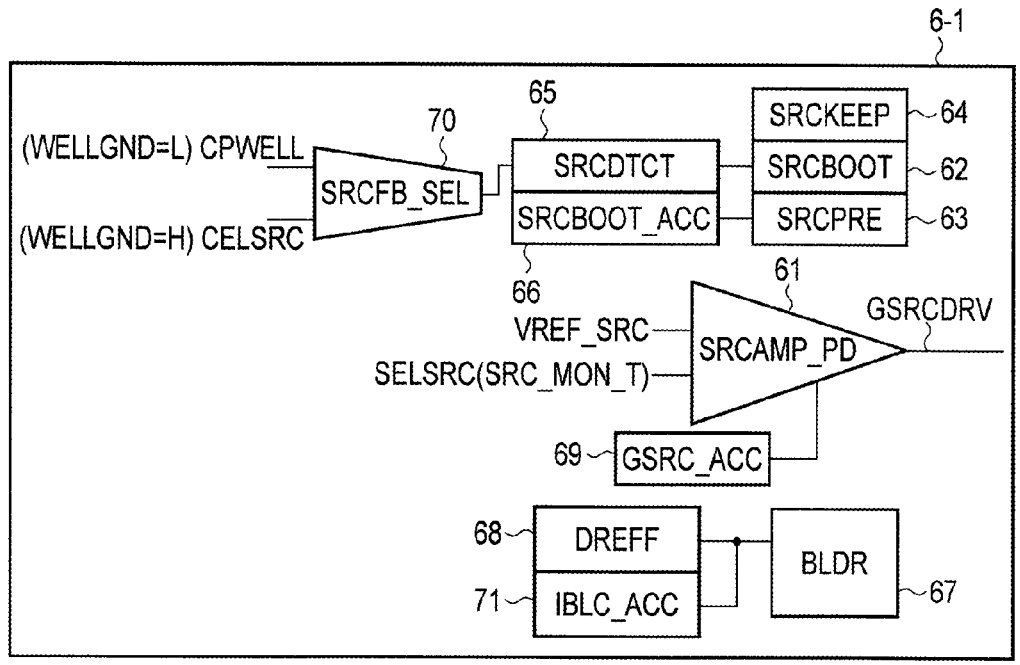
F I G. 3 1
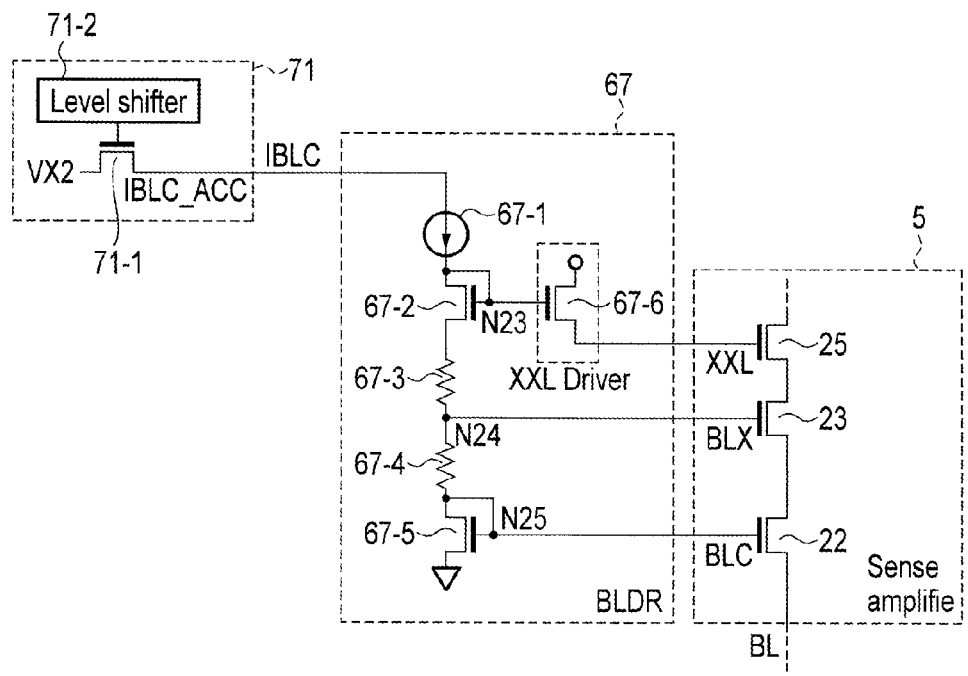
F I G. 3 2

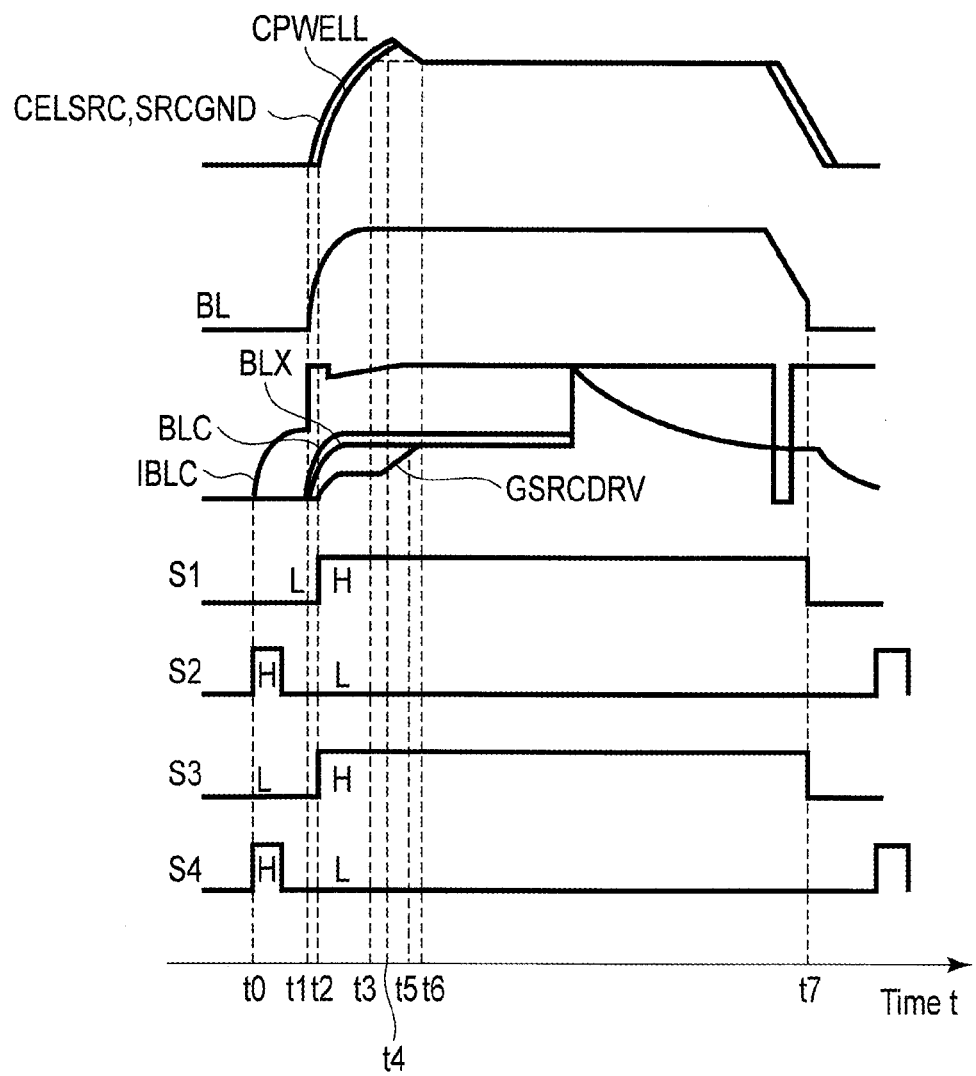
F I G. 33

SEMICONDUCTOR MEMORY DEVICE AND METHOD FOR CONTROLLING THE SAME

CROSS-REFERENCE TO RELATED APPLICATIONS

This application is based upon and claims the benefit of priority from Japanese Patent Applications No. 2012-097806, filed Apr. 23, 2012; No. 2012-097925, filed Apr. 23, 2012; and No. 2012-104083, filed Apr. 27, 2012, the entire contents of all of which are incorporated herein by reference.

FIELD

Embodiments described herein relate generally to a semiconductor memory apparatus which reduces erroneous data, reads data at a more negative threshold level, and which enables charging to be accelerated.

BACKGROUND

A NAND flash memory includes a sense amplifier which reads data held by memory cells. The sense amplifier includes a detector connected to bit lines. The detector detects data depending on the potential of a bit line.

Specifically, the detector detects two-level data which is, for example, held by a memory cell. The memory cell holds "0" data when charge is accumulated in a charge accumulation layer. When the charge exits the charge accumulation layer, a threshold distribution is positioned on a negative side. This corresponds to "1" data, that is, an erased state.

According to one read method, when a threshold positioned on the negative side of the threshold distribution of memory cells is to be read, the data is read by applying a higher voltage to a source than to a gate.

BRIEF DESCRIPTION OF THE DRAWINGS

FIG. 1 is a diagram of an exemplary general configuration of a NAND flash memory according to a first embodiment;

FIG. 2 is a diagram of the threshold distribution of memory cells according to the first embodiment;

FIG. 3 is a diagram of an exemplary detailed configuration of a voltage generator according to the first embodiment;

FIG. 4 is a diagram of an exemplary detailed configuration of a DAC according to the first embodiment;

FIG. 5 is a diagram of an exemplary detailed configuration of a sense amplifier according to the first embodiment;

FIG. 7 is a timing chart showing a read operation according to the first embodiment;

FIG. 10 is a timing chart showing a read operation according to the modification;

FIG. 12 and FIG. 13 are a conceptual drawing showing a write operation according to the second embodiment;

FIG. 14 is a conceptual drawing showing a read operation according to the second embodiment;

FIG. 15 is a circuit diagram of a voltage switching circuit according to a third embodiment;

FIG. 16 is a circuit diagram of a sense amplifier according to the third embodiment;

FIG. 21 is a timing chart of the read operation according to the fourth embodiment;

FIG. 22 is a conceptual drawing of a read operation according to a fifth embodiment;

FIG. 23 is a timing chart of a read operation according to a fifth embodiment;

FIG. 24 is a diagram of an exemplary general configuration of a NAND flash memory according to a sixth embodiment;

FIG. 25 is a diagram of an exemplary configuration of a sense amplifier according to a sixth embodiment;

FIG. 26 is a conceptual drawing of a configuration of a controller and a source line driver, and connections between the controller and the source line driver and the sense amplifier;

FIG. 27 is a timing chart showing a read operation according to a sixth embodiment;

FIG. 29 is a timing chart of a read operation according to a seventh embodiment;

FIG. 30 is a diagram of an exemplary configuration of a controller according to an eight embodiment;

FIG. 31 is a diagram of an exemplary configuration of a controller according to a ninth embodiment;

FIG. 32 is a conceptual drawing showing an example of a configuration of IBLC_ACC and BLDR and the connective relationship between IBLC_ACC and BLDR according to a ninth embodiment; and FIG. 33 is timing chart showing a read operation according to a ninth embodiment.

DETAILED DESCRIPTION

Figure 6:
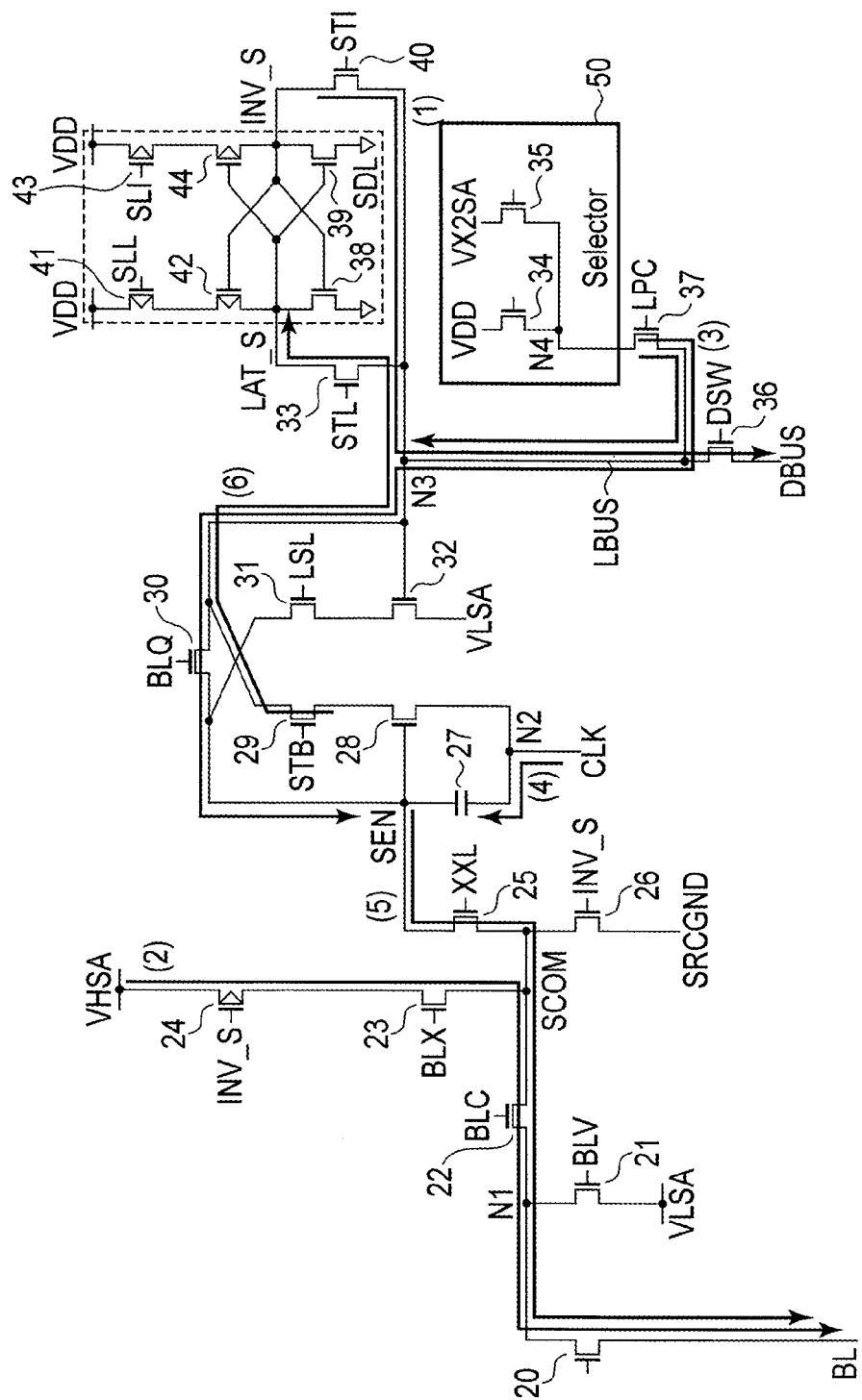
FIG. 6 is a conceptual drawing of a read operation according to the first embodiment.

The present embodiment will be described below with reference to the drawings. In the description, common components are denoted by common reference numerals throughout the drawings. However, it should be noted that the drawings are schematic and that relationships between thicknesses and planar dimensions, the ratio of thicknesses of layers, and the like differ from reality. Thus, specific thicknesses and dimensions should be determined taking the description below into consideration. Furthermore, the dimensional relationship or the ratio of components of course varies among the drawings.

In general, according to one embodiment, a semiconductor memory device includes a first transistor, a detector, and a second transistor. The first transistor is capable of transferring a first voltage to a bit line. The detector reads data held by a memory cell connected to the bit line. The second transistor is capable of transferring a second voltage and a third voltage to the detector. The second voltage is generated by a source different from a source of the first voltage. The third voltage is larger than the second voltage. The second transistor charges the detector to one of the second voltage and the third voltage, while the first transistor transferring the first voltage to the bit line.

First Embodiment

The present embodiment separates a path allowing a NAND string to be charged and a path allowing a detector of a sense amplifier to be charged, to suppress a variation in the potential of the detector (a node SEN described below) of the sense amplifier. The present embodiment also uses a voltage booster even when an external power supply is 1.8 V to raise the potential of the detector, thus ensuring a read margin (for "1" data).

An exemplary general configuration of a semiconductor memory apparatus according to the present embodiment will be described with reference to FIG. 1.

1. <Exemplary General Configuration>

As shown in FIG. 1, the semiconductor memory apparatus according to the present embodiment comprises a memory cell array 1, a row decoder 2, a data input/output circuit 3, a controller 4, a sense amplifier 5, and a voltage generator 6.

1-1. <Memory Cell Array 1>

The memory cell array 1 comprises blocks BLK0 to BLKs (s is a natural number) each including a plurality of nonvolatile memory cells MC. Each of the blocks BLK0 to BLKs comprises a plurality of NAND strings 10 in each of which nonvolatile memory cells MC are connected together in series. Each of the NAND strings 10 includes, for example, 64 memory cells MC and select transistors ST1 and ST2.

The memory cell MC may hold data at two or more levels. The memory cell has an FG structure including a floating gate (charge conduction layer) formed on a p-type semiconductor substrate via an inter-gate insulating film and a control gate formed on the floating gate via an inter-gate insulating film. The structure of the memory cell MC may be of a MONOS type. The MONOS type is a structure with a charge accumulation layer (for example, an insulating film) formed on the semiconductor substrate via the gate insulating film, an insulating film formed on the charge accumulation layer and having a higher permittivity than the charge accumulation layer (the insulating film is hereinafter referred to as a block layer), and a control gate further formed on the block layer.

The control gate of the memory cell MC is electrically connected to a word line. A drain of the memory cell MC is electrically connected to a bit line. A source of the memory cell MC is electrically connected to a source line. Furthermore, the memory cell MC is an n-channel MOS transistor. The number of memory cells MC is not limited to 64 but may be 128, 256, 512, or the like; any number of memory cells MC may be used.

Furthermore, the adjacent memory cells MC share the source and the drain. The memory cells MC are arranged between the select transistors ST1 and ST2 so that current paths in the memory cells MC are connected together in series. A drain area at one end of the array of memory cells MC connected together in series is connected to a source area of the select transistor ST1. A source area at the other end of the array of memory cells MC is connected to a drain area of the select transistor ST2.

The control gates of the memory cells MC on the same row are all connected to one of the word lines WL0 to WL63. Gate electrodes of the select transistors ST1 or ST2 for the memory cells MC on the same row are all connected to a select gate line SGD1 or SGS1, respectively. For simplification of description, the word lines WL0 to WL63 may be hereinafter simply referred to as a word line WL it the word lines are not distinguished from one another. Furthermore, drains of the select transistors ST1 on the same column in the memory cell array 1 are all connected to one of the bit lines BL0 to BLn. The bit lines BL0 to BLn are also hereinafter collectively referred to as a bit line BL if the bit lines are not distinguished from one another (n: natural number). Sources of the select transistors ST2 are all connected to a source line SL.

Furthermore, data is written, at a time, to the plurality of memory cells MC connected to the same word line WL. This unit is referred to as a page.

Moreover, data is erased, at a time, from the plurality of memory cells MC in each block BLK.

1-2. <Threshold Distribution of the Memory Cells MC>

The threshold distribution of the memory cells MC will be described with reference to FIG. 2. FIG. 2 shows the threshold distribution (voltage) on the axis of abscissas and the number of memory cells CM on the axis of ordinate.

As shown in FIG. 2, each memory cell MC may hold data at, for example, two levels (1 bit data: two types of data, "1" and "0", in order of increasing threshold voltage Vth). Furthermore, in an erased state, the memory cell MC is set for "1" data (for example, a negative potential). The memory cell MC is set for a positive threshold potential by writing data to the memory cell to inject charge into the charge accumulation layer.

1-3. <Peripheral Circuit>

Referring back to FIG. 1, a peripheral circuit will be described.

1-3-1. <Row Decoder 2>

The row decoder 2 decodes a block select signal provided by the controller during a data write operation, a data read operation, and a data erase operation. Based on the result of the decoding, the row decoder 2 selects one of the blocks BLK. Then, the row decoder 2 transfers one of a write voltage, a read voltage, and an erase voltage to each of the word lines WL in the selected block BLK. Specifically, the row decoder 2 transfers a select write voltage (hereinafter referred to as a voltage Vpgm) to a write target memory cell MC as a write voltage, while transferring an unselect write voltage (voltage Vpass) to the other memory cells MC.

Furthermore, the row decoder 2 transfers a select read voltage (hereinafter referred to as Vcgr) to a read target memory cell MC as a read voltage, while transferring an unselect read voltage (voltage Vread) to the other memory cells MC.

Additionally, during erasure, the row decoder 2 transfers a zero potential to all the word lines WL extending through the selected block BLK. In this case, a high positive voltage is applied to the semiconductor substrate (well area) on which the memory cells MC are arranged.

1-3-2. <Data Input/Output Circuit 3>

The data input/output circuit 3 outputs an address and a command supplied by a host via an I/O terminal (not shown in the drawings) to the controller 4. Furthermore, the data input/output circuit 3 outputs write data to the sense amplifier 5 via a data line $D_{line}$. The data input/output circuit 3 outputs the data to the host under the control of the controller 4. That is, the data input/output circuit 3 receives data amplified by the sense amplifier 5 via the data line $D_{line}$, and then outputs the data to the host via the I/O terminal.

1-3-3. <Controller 4>

The controller 4 controls the operation of the NAND flash memory as a whole. That is, based on the address and command provided by the host (not shown in the drawings), the controller 4 executes an operating sequence for a data write operation, a data read operation, and a data erase operation via the data input/output circuit 3. Based on the address and the operating sequence, the controller 4 generates a block select signal and a column select signal. The controller 4 outputs the block select signal to the row decoder 2. The controller 4 also outputs the column select signal to the sense amplifier 5. The column select signal selects a column direction for the sense amplifier 5.

Furthermore, the controller 4 is provided with a control signal supplied by a memory controller (not shown in the drawings). Based on the supplied control signal, the controller 4 determines whether a signal supplied by the host to the data input/output circuit 3 via the I/O terminal (not shown in the drawings) is an address or data.

Additionally, the controller 4 controls a timing to supply a signal to each transistor forming the sense amplifier 5.

1-3-4. <Sense Amplifier 5>

During data read, the sense amplifier 5 passes a constant current through the bit line BL and directly senses a current flowing through the memory cell MC after the potential of the bit line BL is stabilized. Thus, the sense amplifier 5 may carry out a read operation on all the bit lines BL at a time. Furthermore, the value of a current flowing through the bit line BL is determined by the data in the memory cell MC. That is, whether the sense amplifier 5 connected to the bit line BL determines the data to be "1" or "0" is determined by the value of the current flowing through the memory cell MC. During data write, the sense amplifier 5 transfers write data to the corresponding bit line BL. The configuration of the sense amplifier 5 will be described below.

1-3-5. <Voltage Generation Circuit 6>

The voltage generator 6 receives an external voltage (hereinafter referred to as a voltage Vcc) and generates the voltage Vpgm, the voltage Vpass, the voltage Vcgr, the voltage Vread, and a voltage Vera. The voltage generator 6 then transfers the voltages to the row decoder 2. Furthermore, the voltage generator 6 receives the external voltage Vcc and generates a voltage VDD, a voltage VHSA (=the voltage VDD), a voltage VX2, and a voltage VX2SA. A configuration which generates the voltage VDD, the voltage VHSA, the voltage VX2, and the voltage VX2SA will be described below with reference to FIG. 3.

1-3-5-1. <Configuration of the Voltage Generator 6>

As shown in FIG. 3, the voltage generator 6 comprises a configuration which generates the voltage VDD, the voltage VHSA, the voltage VX2, and the voltage VX2SA. That is, the voltage generator 6 comprises a VDD generator 6-1, a VHSA generator 6-2, a regulator 6-3, a pump 6-4, and a DAC 6-5.

The VDD generator 6-1 receives the external voltage Vcc and generates the internal voltage VDD based on the external voltage Vcc. Moreover, the VHSA generator 6-2 receives the external voltage Vcc and generates the voltage VHSA (which has the same value as that of the voltage VDD) based on the external voltage Vcc.

The regulator 6-3 receives the voltage Vcc, and increases or reduces the external voltage Vcc according to a desired rule and outputs the increased or reduced voltage to the pump 6-4. The pump 6-4 increases the voltage output by the regulator 6-3 to the voltage VX2 (>VDD). The DAC (Digital-to-Analog Converter) 6-5 receives the voltage VX2 from the pump 6-4 and generates a voltage VX2SA (voltage VDD<voltage VX2SA<voltage VX2). The pump 6-4 may generate the voltage VX2 based on the voltage VDD generated by the VDD generator 6-1.

1-3-5-1-1. <Exemplary Configuration of the DAC 6-5)

An exemplary configuration of the DAC 6-5 will be described with reference to FIG. 4. As shown in FIG. 4, the DAC 6-5 comprises a comparator 11 and resistance elements 12 and 13. The comparator 11 receives the voltage VX2 output by the pump circuit 6-4 and controls an output voltage so that a voltage VREF equals the potential of Nmon. At this time, the comparator 11 outputs the voltage VX2SA to a node Nout. Furthermore, one end of the resistance element 12 is connected to the node Nout. The other end of the resistance element 12 is connected to the node Nmon. One end of the resistance element 13 is connected to the node Nmon. The other end of the resistance element 13 is grounded.

1-3-4-1. <Sense Amplifier 5>

Now, a detailed configuration of the sense amplifier 5 will be described with reference to FIG. 5. As shown in FIG. 5, the sense amplifier 5 comprises n-type MOS transistors 20 to 23, 25, 26, 28 to 40, 46, and 47 and p-channel type MOS transistors 24 and 41 to 45, and a capacitor element 27. The threshold voltage Vth of the MOS transistor with the reference numeral for the MOS transistor represents the threshold voltage of the MOS transistor. For example, threshold potential of the MOS transistor 22 is represented by Vth22.

One end of the electric path in the MOS transistor 20 is connected to the bit line. The other end of the current path is connected to a node N1. A gate of the MOS transistor 20 is supplied with a signal BLS controlled by the controller 4. During a read operation and a write operation, the signal BLS the signal BLS is set to an "H" level to enable the bit line BL and the sense amplifier 5 to be connected together.

A signal supplied to the gate of each MOS transistor which configures the sense amplifier described below is controlled by the controller similarly to the signal BLS supplied to the gate of the MOS transistor 20.

One end of the current path in the MOS transistor 21 is connected to the node N1. The other end of the current path is grounded (voltage VLSA). A gate of the MOS transistor 21 is supplied with a signal BLV. One end of the current path in the MOS transistor 22 is connected to the node N1. The other end of the current path is connected to SCOM. A gate of the MOS transistor 22 is supplied with the signal BLC. A signal BLC clamps the bit line BL to a predetermined potential. When the MOS transistor 22 is provided with the signal BLC=(Vblc+Vth22), the potential of the bit line BL becomes a voltage Vblc. Here, between the signal BLC and the internal voltage VDD in sense amplifier, if the voltage relationship "signal BLC<internal voltage VDD" is established, bit line BL is clamped.

One end of the current path in the MOS transistor 23 is connected to SCOM. The other end of the current path is connected to one end of the MOS transistor 24. A gate of the MOS transistor 23 is supplied with a signal BLX=(voltage (Vblc+Vth23+BLC2BLX)).

Thus, when "1" data is to be read, the potential of SCOM is set to a voltage (Vblc+BLC2BLX) (this will be described below).

The voltage BLC2BLX is a guard band voltage which is effective for reliably transferring the voltage VHSA to SCOM and for increasing the current driving force of the MOS transistor 23 above the current driving force of the MOS transistor 22. For example, when the signal BLX<the signal BLC, the voltage supplied to the bit line BL is limited by the signal BLX. To prevent this, the voltage of the signal BLX is set higher than the signal BLC.

Furthermore, the other end of the current path in the MOS transistor 24 is supplied with the voltage VHSA. A gate of the MOS transistor 24 is supplied with a signal INV_S. The MOS transistor 24 may be omitted. Here, the signal INV_S varies depending on the data held in SDL described below.

One end of the current path in the MOS transistor 25 is connected to a node SCOM. The other end of the current path in the MOS transistor 25 is connected to SEN (detector). A gate of the MOS transistor 25 is supplied with a signal XXL= (Vblc+Vth25+BLC2BLX+BLX2XXL). The gate of the MOS transistor 25 is supplied with a voltage higher than the voltage of the MOS transistor 23 by the value of the voltage BLX2XXL. Here, the voltage BLX2XXL is a guard band voltage which allows charge accumulated in SEN to be transferred to SCOM.

Here, between the signal BLC and the signal BLX and the signal XXL, the voltage relationship "signal BLC<signal BLX<signal XXL" is established. That is, the current driving force of the MOS transistor 25 is greater than the current driving force of the MOS transistor 23. The reason is as follows. When "1" data is sensed, a current flowing through the MOS transistor 25 is set larger than a current flowing through the MOS transistor 23 to pass the potential of the node SEN through the bit line BL.

The configuration will be subsequently described. One end of the current path in the MOS transistor 26 is connected to SCOM. The other end of the current path in the MOS transistor 26 is grounded (voltage SRCGND). A gate of the MOS transistor 26 is supplied with the signal INV_S.

Furthermore, in a lockout read adopted by the sense amplifier 5 according to the present embodiment, the MOS transistor 26 is turned on to set the bit line BL to the ground potential. This will be described below.

Additionally, one electrode of the capacitor element 27 is supplied with a clock CLK (=the voltage (Vblc+BLC2BLX)) via a node N2. The other electrode of the capacitor element 27 is connected to the node SEN. The clock CLK has a function to boost the potential of the node SEN. One end of the current path in the MOS transistor 28 is connected to the node N2. A gate of the MOS transistor 28 is supplied with a signal SEN. That is, the MOS transistor 28 is turned on and off depending on the potential of the node SEN. One end of the current path in the MOS transistor 29 is connected to the other end of the MOS transistor 28. The other end of the current path in the MOS transistor 28 is connected to a node N3. A gate of the MOS transistor 29 is supplied with a signal STB. One end of the current path in the MOS transistor 30 is connected to the node SEN. The other end of the current path in the MOS transistor 30 is connected to a node N3. A gate of the MOS transistor 30 is supplied with a signal BLQ (=a voltage (VX2SA Vth30+Vα). Here, the voltage Vα is added to allow the voltage VX2SA transferred from the MOS transistors 35 and 37 described below to be reliably transferred to the node SEN (the voltage Vα is a guard band voltage). The voltage Vα in a signal LPC, described below, similarly functions as a guard band signal.

One end of the current path in the MOS transistor 31 is connected to the node SEN. A gate of the MOS transistor 31 is supplied with a signal LSL. One end of the current path in the MOS transistor 32 is connected to the other end of the current path in the MOS transistor 31. The other end of the current path in the MOS transistor 32 is grounded (voltage VLSA). A gate of the MOS transistor 32 is connected to the node N3. The MOS transistors 31 and 32 calculate data.

One end of the current path in the MOS transistor 33 is connected to the node N3. The other end of the current path in the MOS transistor 33 is connected to a node LAT_S. A gate of the MOS transistor 33 is supplied with a signal STL. The signal STL is supplied by the controller 4. That is, the MOS transistor 33 is turned on or off by the controller 4.

One end of the current path in the MOS transistor 36 is connected to the node N3. The other end of the current path in the MOS transistor 36 is connected to DBUS (to the ground potential as required). A gate of the MOS transistor 36 is supplied with a signal DSW. The signal DSW is supplied by the controller 4. That is, the MOS transistor 36 is turned on or off the controller 4.

One end of the current path in the MOS transistor 37 is connected to a node N4. The other end of the current path in MOS transistor 37 is connected to the node N3. A gate of the MOS transistor 37 is supplied with the signal LPC (=a voltage (VX2SA+Vth37+Vα)). The signal LPC is supplied by the controller 4. That is, the MOS transistor 37 is turned on or off by the controller 4.

Here, the MOS transistor 37 is of an n-channel type. If the MOS transistor 37 is of a p-channel type, extra time and effort is required for manufacturing steps such as production of wells. Specifically, the voltage VX2SA is applied to a p-well diffusion layer and the voltage VDD is applied to an n-well, a forward voltage from the p-well diffusion layer to the n-well is applied. Thus, the n-well needs to be set to a voltage equal to or higher than the voltage VX2SA and needs to be isolated from the other n-wells. This enlarges the layout of the memory. Because of such required time and effort, the n-channel type MOS transistor is used. Wiring to which the node N3 is connected is sometimes referred to as LBUS.

Furthermore, the MOS transistor 37 includes a select circuit 50 which selects and outputs one of the voltage VDD and voltage VX2SA generated by the voltage generator 6. The select circuit 50 comprises the MOS transistors 34 and 35. One end of the current path in the MOS transistor 34 is supplied with the voltage VDD generated by the power generation circuit 6 (VDD generator 6-1). The other end of the current path in the MOS transistor 34 is connected to a node N4. A gate of the MOS transistor 34 is supplied with a signal S1.

Additionally, one end of the current path in the MOS transistor 35 is supplied with the voltage VX2SA generated by the power generation circuit 6. The other end of the current path in the MOS transistor 35 is connected to the node N4. A gate of the MOS transistor 35 is supplied with a signal S2. The signals S1 and S2 are set to the "H" level at the right moment when the voltage generator 6 generates the voltage VDD or the voltage VX2SA. Thus, the voltage VDD or the voltage VX2SA is supplied to the node N3 (interconnect LBUS) via the MOS transistor 37.

One end of the current path in the MOS transistor 38 is connected to the node LAT_S. The other end of the current path is grounded. A gate of the MOS transistor 38 connects to the node INV_S. One end of the current path in the MOS transistor 39 is connected to the node INV_S. The other end of the current path in the MOS transistor 38 is grounded. A gate of the MOS transistor 39 is connected to the node LAT_S. One end of the current path in the MOS transistor 40 is connected to the node INV_S. The other end of the current path in the MOS transistor 40 is connected to the node N3. A gate of the MOS transistor 40 is supplied with a signal STI. One end of the current path in the MOS transistor 41 is supplied with the voltage VDD. A gate of the MOS transistor 41 is supplied with a signal SLL. One end of the current path in the MOS transistor 42 is connected to the other end of the current path in the MOS transistor 41. The other end of the current path in the MOS transistor 42 is connected to the node LAT_S. A gate of the MOS transistor 42 is connected to the node INV_S. One end of the current path in the MOS transistor 43 is supplied with the voltage VDD. A gate of the MOS transistor 43 is supplied with a signal SLI. One end of the current path in the MOS transistor 44 is connected to the other end of the current path in the MOS transistor 43. The other end of the current path in the MOS transistor 44 is connected to the node INV_S. A gate of the MOS transistor 44 is connected to the node LAT_S. That is, the MOS transistors 38, 39, 42, and 43 form a latch circuit SDL which holds the data in the node LAT_S.

2. <Read Operation by the Sense Amplifier 5>

Now, a read operation performed by the sense amplifier 5 will be described with reference to FIG. 6 and FIG. 7. FIG. 6 is a conceptual drawing showing the operation of the sense amplifier 5 in chronological order from (1) to (6). FIG. 7 is a timing chart showing signals supplied to the MOS transistors forming the sense amplifier 5, and the potentials of the nodes. Specifically, the axis of ordinate indicates an output from the power generation circuit 6, the signal BLQ, the signal BLX, the signal BLC, the node SEN, the signal LPC, the clock CLK, the signal XXL, the signal STL, the signal SLL, the signal STB, the signal DSW, the signal STI, the signal SLI, the node LAT_S, and the node N3 (the potential of the interconnect LBUS). The axis of abscissas indicates time. The sense amplifier 5 according to the first embodiment carries out a lockout read. The lockout read fixes the potential of the bit line BA connected to the memory cell MC to an "L" level during the first read operation.

First, the latch circuit SDL is reset to set the node LAT_S to the "H" level ((1), FIG. 6). That is, as shown in FIG. 7, at time T1, the signal STI is set to the "H" level. Then, at time t2, the signal DSW is set to the "H" level, and the signal SLI is set to the "H" level. This turns on each of the MOS transistor 40 and the MOS transistor 36, and causes the node INV_S to be grounded ("L" level). Thus, the MOS transistor 42 is turned on, and the MOS transistor 38 is turned off. Furthermore, at this time, the node N3 is also grounded to set the potential of the interconnect LBUS to the "L" level.

At time t1, the signal SLL is at the "L" level, the MOS transistor 41 is on. Thus, at time t2, the latch circuit holds "1" data (the node LAT_S=the "H" level).

Furthermore, simultaneously with (1) described above, a constant current is passed to the bit line BL (2). That is, as shown in FIG. 7, at time t1, each of the signal BLX and the signal BLC is set to the "H" level to pass the constant current along a path from the MOS transistor 24 through the MOS transistor 23 and the MOS transistor 22 to the MOS transistor 20. Additionally, although not shown in the drawings, the signal S1 is set to the "H" level before time t1 to keep the potential of the node N4 at the voltage VDD.

Then, as shown in FIG. 6, the node SEN is charged through a path from the MOS transistor 37 to the MOS transistor 30 (3). That is, as shown in FIG. 7, at time t5, each of the signal LPC and the signal BLQ is set to the "H" level. Specifically, as described above, the signal LPC is set to the voltage (VX2SA+Vth37+Vα), and the signal BLQ is set to the voltage (VX2SA+Vth30+Vα). Then, the node SEN starts increasing its voltage from 0 V at time t5. At this time, the signal DSW is at the "L" level.

Subsequently, at time t6, when the potential of the node SEN reaches the voltage VDD, the voltage generator 6 supplies the voltage VX2SA to the MOS transistor 35. At this moment, the signal S1 is set to the "L" level, and the signal S2 is set to the "H" level. This raises the potential of the node LBUS, and at time t7, the potential of the node SEN reaches the voltage VX2SA. Then, at time t7, the signal BLQ is allowed to transition to the "L" level. At time t8, the signal LPC is allowed to transition to the "L" level. That is, the charging of the node SEN through the path (3) is finished. The timing for the voltage generator 6 to supply the voltage VX2SA to the MOS transistor 35 is controlled by the controller 4. This is because the controller 4 expects the potential of the node SEN to reach the voltage VDD at t6. This allows the controller 4 to instruct the voltage generator 6 to supply, at this timing, the voltage VX2SA to the MOS transistor 35.

Then, as shown in FIG. 6, the potential of the node SEN is boosted via the capacitor element 27 (4). That is, as shown in FIG. 7, at time t9, the clock CLK is applied to one electrode of the capacitor element 27 to boost the potential of the node SEN. That is, capacitive coupling serves to raise the potential of the node SEN from the voltage VX2SA. At time t10, the potential of the node SEN reaches a voltage (VX2SA+Vblc+BLC2BLX).

Then, as shown in FIG. 6, a sense operation is performed (5). That is, the node SEN and the bit line are electrically connected together via the MOS transistor 25, the MOS transistor 22, and the MOS transistor 20. As described above, since the signal XXL>the signal BLX, the MOS transistor 25 has a greater current driving force than the MOS transistor 23. That is, the current flowing through the path shown in (5) rather than in (2) is preferentially passed to the bit line BL. At this time, the signal XXL is set to the "H" (Vblc+Vth25+BLC2XXK+BLC2BLX) (see FIG. 7).

At this time, if the data held by the memory cell MC is "1", the NAND string 10 is made electrically continuous, thus causing the bit line BL to transition to the ground potential. Hence, at time t11, the potential of the node SEN decreases from the voltage (VX2SA+Vblc+BLC2BLX) to the voltage (Vblc+BLC2BLX) (FIG. 7, (b)).

Furthermore, at this time, a current flows toward the bit line BL along the path (2), so that the potential of SCOM is equal to the voltage (Vblc+BLC2BLX), which is lower than the original potential by the threshold of the MOS transistor 25.

Subsequently, at time t12, the potential of the clock CLK decreases from the voltage (Vblc+BLC2BLX) to 0 V. In response, the potential of the node SEN decreases by a value equivalent to the boost. That is, the potential of the node SEN is 0 V.

In contrast, if the data held by the memory cell MC is "0", the NAND string 10 is electrically discontinuous and prevents the bit line BL from decreasing. Thus, on the path (5), only a small amount of charge flows out from the node SEN to the bit line BL. That is, no change in the potential of the node SEN is observed which is sufficient to turn on the MOS transistor 28.

As a result, as shown in FIG. 7, the voltage (VX2SA+Vblc+BLC2BLX) is maintained after t11 (a). Furthermore, as described above, the clock CLK decays at time t12 to set the potential of the node SEN to the voltage VX2SA.

Finally, a latch operation is performed. That is, the potential of the node SEN is transferred to the latch circuit SDL (6).

First, the potential of the node N3 is set to the voltage VDD. That is, as shown in FIG. 7, the signal LPC is set to the "H" level at time t13 to charge the node N3 to the voltage VDD through the path (3).

Subsequently, at t14, the signal SLL is set to the "H" level to turn off the MOS transistor 41. Moreover, at t15, the signal STL and the signal STB are set to the "H" level to turn on the MOS transistors 29 and 33, respectively.

Here, if the node SEN is at the "H" level (the data held by the read memory cell MC="0"), that is, if the MOS transistor 28 is on, then the node N2 (which is at the ground potential because the clock CLK="L") and the node LAT_S are electrically continuous. Thus, at time t15, the potential of the node LAT_S is at the "L" level, that is, the latch circuit holds "0" data.

In contrast, if the node SEN is at the "L" level (the data held by the read memory cell MC="1"), that is, if the MOS transistor 28 is off, then the node N2 is electrically discontinuous with the node LAT_S. Thus, the latch circuit holds the existing data ("1" data). That is, at time t15, the potential of the node LAT_S is maintained at the "H" level.

3. <Sense Margin>

Figure 8:
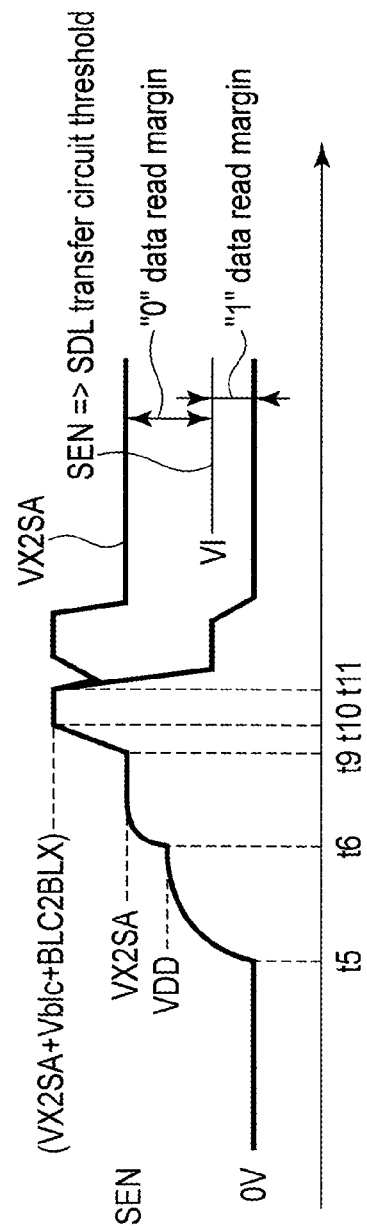
FIG. 8 is a conceptual drawing showing which a sense margin in the sense amplifier according to the first embodiment may be increased.

Now, with reference to FIG. 8, a sense margin will be described using the signals listed in the above-described timing chart. FIG. 8 is a timing chart corresponding to FIG. 7 in which the potential of the node SEN and the threshold line of the MOS transistor 28 are shown enlarged.

As shown in FIG. 8, the potential of the node SEN remains equal to the voltage VX2SA after time t12. The threshold voltage of the MOS transistor 28 is equal to the voltage V1 (also referred to as a transfer circuit threshold V1). Here, the relationship between the voltage V1 and the voltage VX2SA needs to be the voltage VX2SA>2×the voltage V1.

As shown in FIG. 8, when the memory cell MC at the node SEL holds "0" data, a "0" data read margin is equal to a voltage (VX2SA−V1). That is, compared to a variation in the threshold of the MOS transistor 28, the voltage VX2SA has a sufficiently larger value than the voltage V1.

For example, a comparative example will be described in which the potential of the node SEN is equal to the voltage VDD (<the voltage VX2SA). In this case, the potential difference between the voltage VDD and the transfer circuit threshold V1 is smaller than the voltage VX2SA. That is, the potential difference is equal to a voltage (VDD−V1), precluding a sufficient margin from being ensured when "0" data is read. This prevents the MOS transistor 28 from being turned on, precluding "0" data from being read. That is, erroneous read may occur.

In contrast, the semiconductor memory apparatus according to the present embodiment makes the margin greater than the voltage (VDD−V1) as described above, enabling a reduction in erroneous reads.

<Effects of the Present Embodiment>

The semiconductor memory apparatus according to the present embodiment may exert the following effects (1) to (5).

(1) A Variation in the Potential of the Node SEN May be Suppressed (1).

The effect (1) will be described with a comparison between a sense amplifier according to the comparative example and the sense amplifier according to the present embodiment. The sense amplifier according to the comparative example includes a MOS transistor enabling a connection between the node SEN and the node to which both the MOS transistor 24 and the MOS transistor 23 are connected as shown in FIG. 5. Such a configuration according to the comparative example charges the node SEN via an omitted MOS transistor (hereinafter referred to as a transfer transistor), while using the voltage VHSA (=VDD) to pass a current to the NAND string 10 via the MOS transistors 24 and 23. The voltage VHSA is supplied by the VHSA generator 6-2 shown in FIG. 3, which supplies the voltage VDD to all the sense amplifiers 5.

Thus, during a read operation, a large number of electrically continuous NAND strings 10 conventionally drop the voltage VDD supplied to the sense amplifier 5, preventing the node SEN from being sufficiently charged. Thus, during a sense operation, the potential of the node SEN does not rise. This prevents a sufficient sense margin from being ensured, resulting in erroneous data reads.

In contrast, the sense amplifier 5 dispenses with the transfer MOS transistor provided in the sense amplifier 5, and uses a different path to charge the node SEN. Thus, even with a large amount of current flowing to the NAND string 10, the use of the different path for charging the node SEN enables a variation in the charging of the node SEN to be suppressed.

(2) A Variation in the Potential of the Node SEN May be Suppressed (2).

Furthermore, since the semiconductor memory apparatus according to the present embodiment dispenses with the transfer transistor, a variation in the potential of the node SEN during charging of the node SEN may be suppressed which is caused by a variation in the threshold of the transistor itself.

(3) The Area of the Semiconductor Memory Apparatus May be Reduced.

The semiconductor memory apparatus according to the present embodiment is configured to dispense with the transfer transistor as described above. The conventional art includes many sense amplifiers 5 as the bit lines BL and thus a large number of, for example, $2 \times 2^{10}$ sense amplifiers 5. That is, the semiconductor memory apparatus according to the present embodiment has a reduced area corresponding to a reduced number of sense amplifiers 5.

(4) A Sufficient Sense Margin May be Ensured.

The semiconductor memory apparatus according to the present embodiment uses the different path for charging the node SEN as described above. This eliminates the need to use the VHSA generator 6-2 as a source for charging the node SEN. That is, the node SEN may be supplied with a high voltage so as to have a sufficient sense margin. Thus, the semiconductor memory apparatus according to the present embodiment uses the pump circuit 6-4, which may provide 1.8-V boost, to generate VX2SA (>VDD) and charges the generated VX2SA through the path (3). Thus, a sufficient sense margin may be ensured by setting the potential of the node SEN equal to VX2SA. That is, even if an external power supply VCC has a low voltage of 1.8 V, a sense margin may be ensured as in the case where the external voltage VCC is 3.0 V. This enables a reduction in erroneous data reads. The reasons for the use of the boosted voltage are as follows. First, during the steps of manufacturing the plurality of MOS transistors forming the sense amplifier 5, extra time and effort is required to separately form a MOS transistor 28 and adjust the threshold level of the MOS transistor 28. Furthermore, the layout area is increased. Second, if the potential of the node SEN is lower than the voltage VDD, the potential of the node SEN is close to SEN=>the SDL transfer circuit threshold (the threshold level of the MOS transistor 28) shown in FIG. 8. As a result, the MOS transistor 28 is turned on, but the node N2 and the node N3 are barely connected together. A very small current flows through the path (6). That is, a long time is required for data transfer. For an actual data transfer operation, the sense amplifier 5 is divided into a plurality of blocks so that these blocks carry out data transfer in order. Thus, no charge may remain for the capacitor element 27 of the last sense amplifier 5 to carry out data transfer, precluding accurate data reads. For these reasons, the present embodiment adopts a method for boosting the potential of the node SEN.

Furthermore, according to the present embodiment, the capability of charging the node SEN with the voltage VX2SA is sufficient. This eliminates the need to generate VX2SA when the charging is completed, enabling power consumption to be suppressed. Additionally, this charge period may be finished before the constant current is passed through the bit line BL to perform a sense operation. That is, even if the configuration of the sense amplifier 5 is changed so as to charge the charge path, a possible delay of completion of read may be avoided.

(5) Power Consumption May be Reduced.

As described above, the semiconductor memory apparatus according to the present embodiment adopts the lockout read. This eliminates the need to pass current through all the bit lines BL, enabling reduced power consumption.

<Implementation of the Present Embodiment>

Whether the present embodiment is implemented may be determined, by way of example, by measuring, during a data read operation, the potential of the node N3, located between the node SEN and the select circuit 50. When, for example, the potential of the node N3 is higher than the voltage VDD during a data read operation, the present embodiment may be utilized.

<Modification>

Now, a modification according to the first embodiment will be described with reference to FIG. 9 and FIG. 10. According to the modification, the charging potential for the node SEN is set to the voltage VDD rather than to the voltage VX2SA. Even in this case, given effects may be exerted. The same components of the modification as the corresponding components of the first embodiment will not be described.

1. <Configuration of the Sense Amplifier 5>

Figure 9:
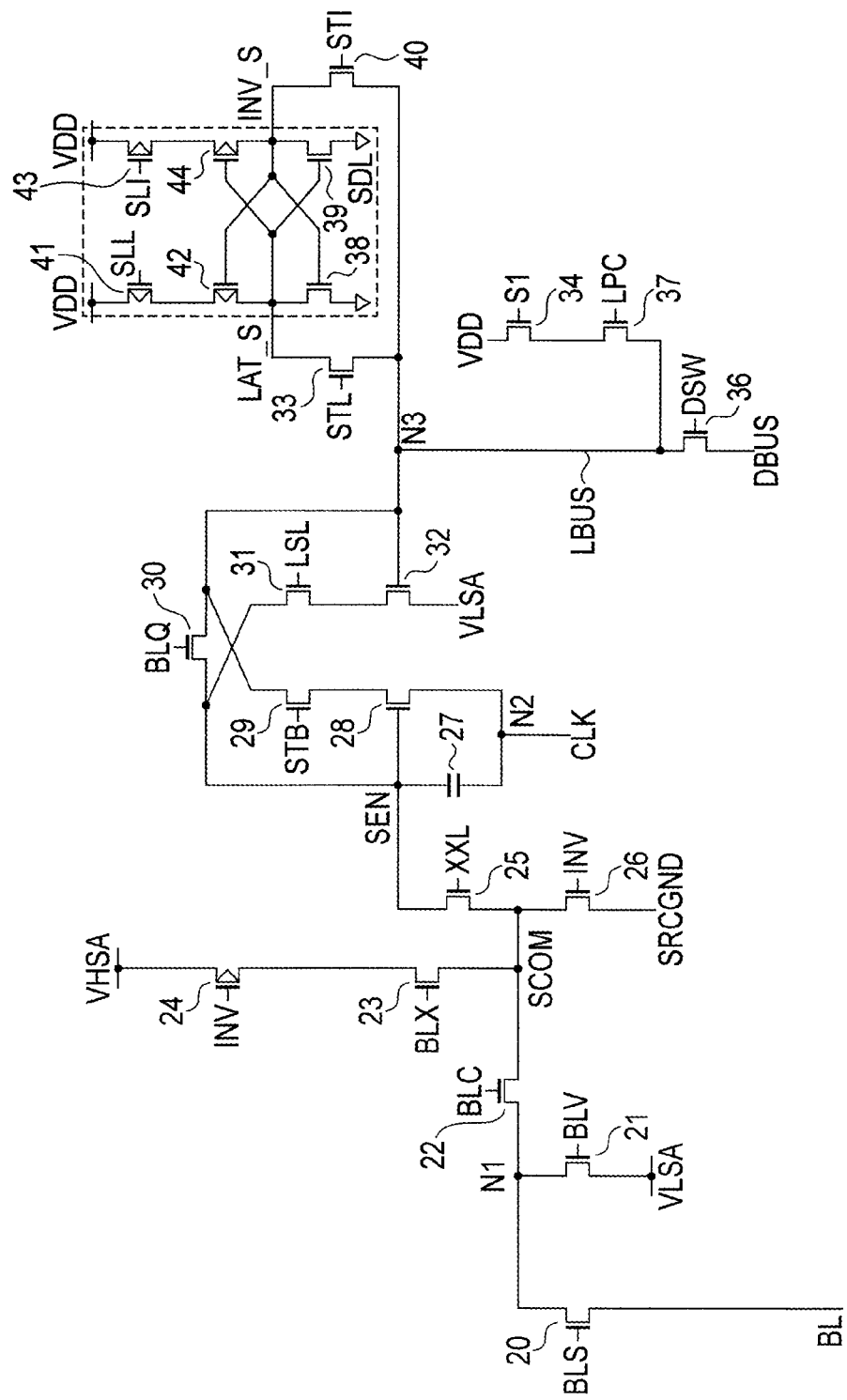
FIG. 9 is a diagram of an exemplary configuration of a sense amplifier according to a modification.

As shown in FIG. 9, the sense amplifier 5 according to the modification is configured to dispense with the above-described select circuit 50. Specifically, the sense amplifier 5 according to the modification is configured to dispense with the MOS transistor 35, which outputs the voltage VX2SA. A procedure for a read operation from (1) to (5) using the configuration in FIG. 9 is similar to the procedure according to the first embodiment and will thus not be described below.

2. <Read Operation>

Now, a read operation performed by the sense amplifier 5 according to the modification will be described with reference to FIG. 10. FIG. 10 is a timing chart showing the read operation. Portions of the operation which are similar to the corresponding portions according to the first embodiment will not be described below.

As shown in FIG. 10, the voltage generator 6 constantly outputs the voltage VDD. Thus, when the signal LPC and the signal BLQ are set to the "H" level at time t5, the potential of the node SEN correspondingly rises from the zero potential to the voltage VDD. When the signal LPC and the signal BLQ are set to the "L" level at time t7 and at time t8, respectively, the potential of the node SEN is a floating state. Thus, the node SEN maintains the voltage VDD. Then, at time t9, the potential of the node SEN is boosted by the clock CLK, and at time t10, reaches a voltage (VDD+Vblc+BLC2BLX). At this timing, the signal XXL is set to the "H" level to perform a sense operation. If the sense operation leaves the NAND string 10 electrically discontinuous, the potential of the node SEN is set equal to (a), that is, the voltage VDD. In contrast, if the NAND string 10 is made electrically continuous, the potential of the node SEN transitions to (b), that is, the zero potential. Subsequently, a latch operation is performed.

<Effects of the Modification>

Even the semiconductor memory apparatus according to the present embodiment may exert the above-described effects (1) to (3). That is, like the first embodiment, the modification uses a different path to charge the node SEN and thus exerts the corresponding effects. Namely, during charging, a variation in the potential of the node SEN may be suppressed. Furthermore, the area of the memory may be reduced.

The semiconductor memory apparatuses according to the first embodiment and the modification enable the output from the DAC 6-5 to be varied by switching the resistance element 12. As the value of the voltage VREF, data stored in a management data storage area is used. The management data storage area is arranged in the memory cell array 1. A user area (in which net data is stored) is another area not shown in the drawings.

Second Embodiment

Now, a semiconductor memory apparatus according to a second embodiment will be described with reference to FIG. 11 to FIG. 14. In the semiconductor memory apparatus according to the second embodiment, the sense amplifier 5 dispenses with the MOS transistor 24 and the MOS transistor 26 and further comprises MOS transistors 45 to 47. The configuration of the sense amplifier 5 will be described below.

1. Sense Amplifier 5

Figure 11:
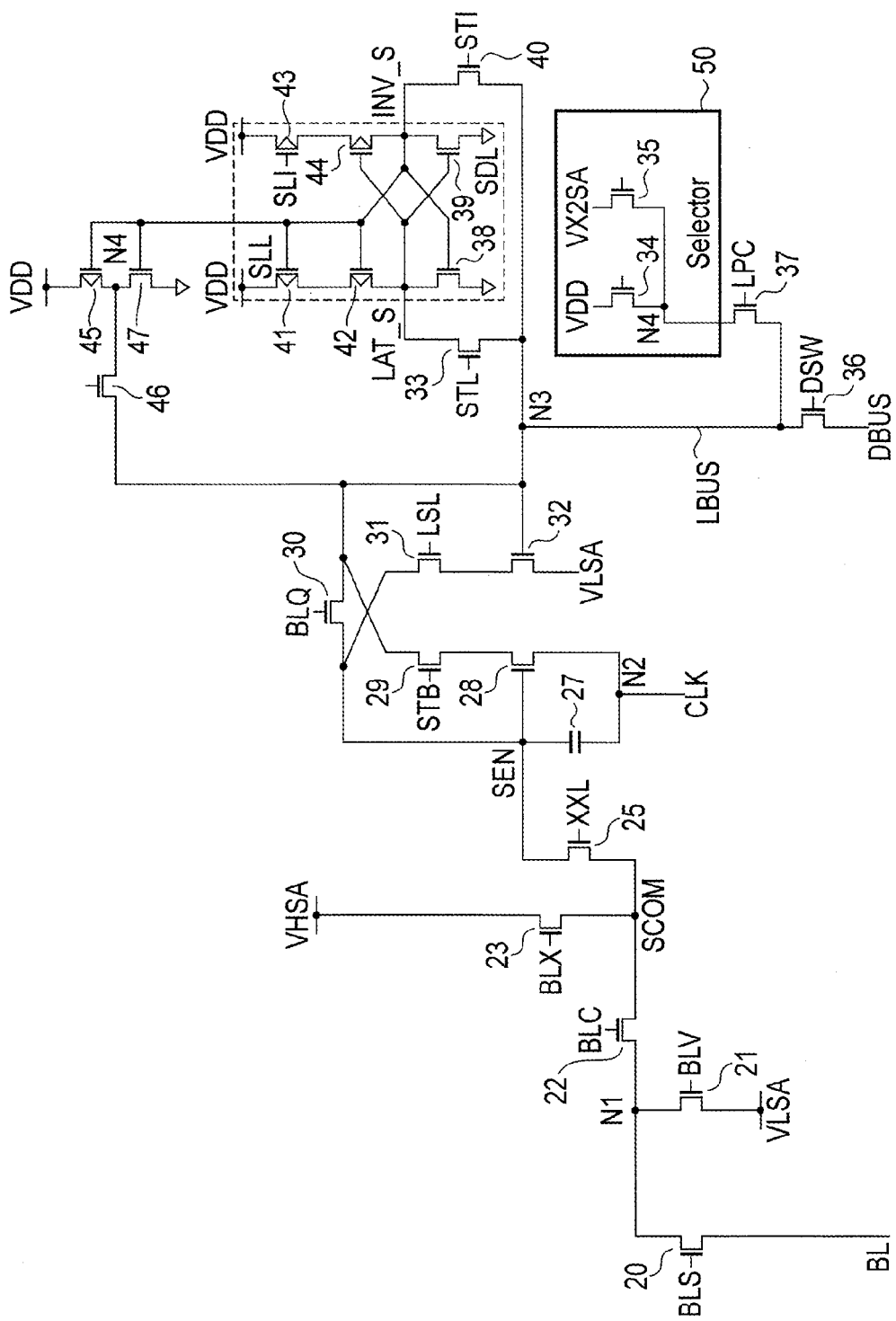
FIG. 11 is a diagram of an exemplary detailed configuration of a sense amplifier according to a second embodiment.

As shown in FIG. 11, in the sense amplifier 5, one end of the current path in the MOS transistor 23 is supplied with the voltage VHSA. Furthermore, one end of the current path in the MOS transistor 45 is supplied with the voltage VDD. The other end of the current path is connected to the node N4. A gate of the MOS transistor 45 is connected to the node INV_S. One end of the current path in the MOS transistor 46 and the other end of the current path in the transistor 45 are both connected to the node N4. The other end of the current path in the MOS transistor 46 is grounded. Additionally, one end of the current path in the MOS transistor 46 is connected to the node N4. The other end of the current path is connected to the node N3. The MOS transistors 45 to 47 have a function to precharge the bit line BL to a predetermined voltage during data write.

2. Write Operation

Figure 12:
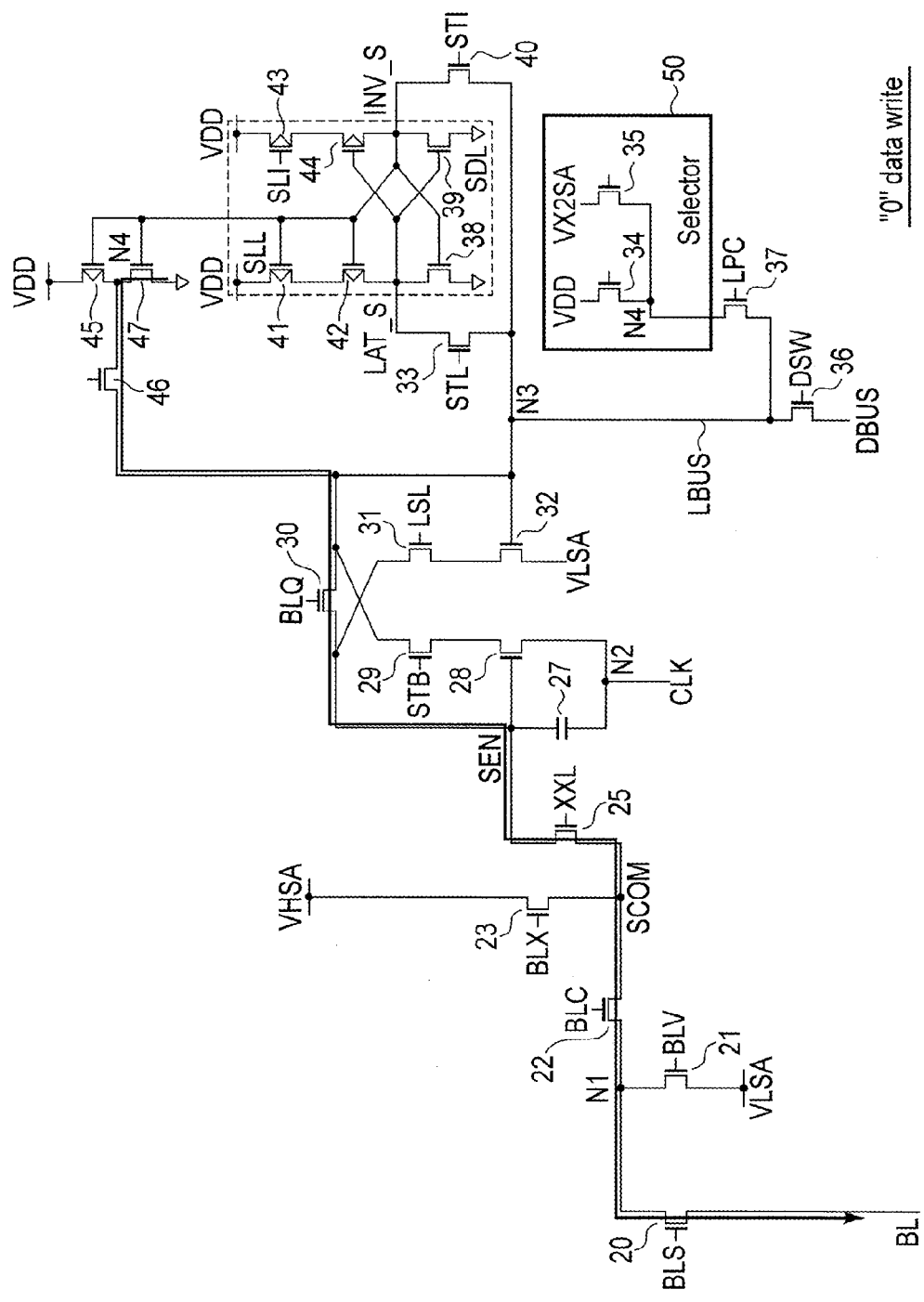

Now, an operation of writing "0" data or "1." data will be described with reference to FIG. 12 and FIG. 13.

<"0" Data Write>

When "0" data is to be written to the memory cell MC, the sense amplifier 5 supplies the bit line BL with a write permission voltage, that is, the zero potential in order to provide a high voltage between the channel area of the memory cell MC and the word line (control gate CG). Specifically, the signal INV_S is set to the "H" level, and the gates of the MOS transistor 46, the MOS transistor 30, and the MOS transistor 25 are supplied with the voltage VX2 to turn on the MOS transistors 46, 30, and 25. Moreover, the signal BLC and the signal BLS are set to the "H" level. Thus, as also shown in FIG. 12, the bit line BL is supplied with the ground potential via the MOS transistors 47, 46, 30, 25, 22, and 20. Then, the row decoder 2 transfers the write voltage Vpgm and Vpass supplied by the voltage generator 6 to the word line WL to inject charge into the charge accumulation layer of the write target memory cell MC. Thus, "0" data is written to the memory cell MC.

<"1" Data Write>

When "1" data is to be written to the memory cell MC, a potential difference which escapes from varying the threshold is applied between the channel area of the memory cell MC and the word line (control gate CG). That is, the sense amplifier 5 supplies a write inhibition voltage, for example, the voltage VDD, to the bit line BL. Specifically, the "1" data write is different from the "0" data write in that the bit line BL is supplied with the voltage VDD by setting the signal INV_S to the "L" level and turning on the MOS transistor 45. The voltage VX2 is sufficiently higher than the thresholds of the MOS transistors 46, 30, and 25, thus preventing the voltage from being reduced by the thresholds of the MOS transistors 46, 30, and 25. This also applies to the MOS transistors 22 and 20.

3. Read Operation

Now, an operation of reading "0" data or "1" data will be described with reference to FIG. 14. This operation does not use the lockout read but re-reads data from the memory cell MC determined to contain "1" data during the first data read. That is, as shown in FIG. 14, the read method according to the second embodiment precharges the bit line BL for every read operation.

<Effects of the Second Embodiment>

The semiconductor memory apparatus according to the second embodiment may exert an effect (6) in addition to the effects (1) to (4) described above.

(6) The Area of the Memory May Further be Reduced.

The sense amplifier 5 in the semiconductor memory apparatus according to the second embodiment is entirely formed of n-channel type MOS transistors except for the latch circuit SDL and the select circuit 50. Specifically, a part of the sense amplifier 5 comprising the MOS transistor 20 to MOS transistor 25 and the MOS transistor 28 to MOS transistor 32 is entirely formed of n-channel type MOS transistors. This enables a reduction in isolation areas between the transistors and thus in layout area.

Third Embodiment

Now, a semiconductor memory apparatus according to a third embodiment will be described with reference to FIG. 1 and FIG. 15 to FIG. 19. During data read, the semiconductor memory apparatus according to the third embodiment applies a positive voltage to CELSRC to apply a negative voltage to the gate of the memory cell MC in a pseudo manner, thus reading the negative threshold of the memory cell MC. CELSRC corresponds to the node of the source line SL to which a plurality of NAND strings are all connected, as described below. The potential of this node may also be represented as CELSRC.

1. <Configuration>

1-1. <Controller 4>

In FIG. 1, the controller 4 according to the present embodiment controls, during a read operation, timings to supply signals (a signal S1, a signal S2, and a signal S3 described below) to the transistors forming the sense amplifier 5 and the magnitude of the voltage applied to each of the transistors.

1-2. <Voltage Generator 6>

In FIG. 1, the voltage generator 6 according to the present embodiment generates and supplies the voltage V1 to CELSRC. The voltage generator 6 also comprises a voltage switching circuit 6-1. For example, during read, the voltage switching circuit 6-1 generates and outputs a signal BLX and a signal BLC each having a predetermined magnitude, to the sense amplifier 5. A configuration of the voltage switching circuit 6-1 will be described with reference to FIG. 15.

1-2-1. Configuration of the Voltage Switching Circuit 6-1

FIG. 15 shows a configuration of the voltage switching circuit 6-1. The voltage switching circuit 6-1 has a function to adjust the difference in voltage between the signal BLX and the signal BLC. As shown in FIG. 15, the voltage switching circuit 6-1 comprises a current source 50, n-channel type MOS transistors 51 to 53, resistance elements 54 to 57, and a mirror circuit 58.

The current source 50 is supplied with the internal voltage VDD at an input end of the current source 50 to output, for example, a current $I_{58}$ to a node N11. The node N11 connects to one end of the current path in the MOS transistor 51. The other end of the current path is connected to a node N12. A gate of the MOS transistor 51 is supplied with the signal S1. Furthermore, both one end of the current path in the MOS transistor 52 and the other end of the current path in the MOS transistor 51 are connected to the node N12. The other end of the current path is connected to a node N13. A gate of the MOS transistor 52 is supplied with the signal S2. Moreover, both one end of the current path in the MOS transistor 53 and the other end of the current path in the MOS transistor 52 are connected to the node N13. The other end of the current path is connected to a node N14. A gate of the MOS transistor 53 is supplied with the signal S3. As described above, each of the signals S1 to S3 which is at either the "L" or "H" level is supplied by the controller 4.

Furthermore, one end of the resistance element 54 is connected to the node N11. The other end of the resistance element 54 is connected to the node N12. One end of the resistance element 55 is connected to the node N12. The other end of the resistance element is connected to the node N13. Moreover, one end of the resistance element 56 is connected to the node N13. The other end of the resistance element 56 is connected to the node N14.

Moreover, the node 14 connects to the mirror circuit 58. A configuration of the mirror circuit 58 will be described. The mirror circuit 58 is formed of, for example, 25 n-channel type MOS transistors 58-1 to 58-25 arranged in parallel (the number of n-type MOS transistors is denoted by n). That is, gates and drains of the MOS transistors 58-1 to 58-25 are connected together so that the MOS transistors 58-1 to 58-25 allow, for example, $I_{58}$ to flow toward CELSRC.

When the signals S1 to S3 are placed into an off state, the current I58 flows through the resistance elements 54 to 56 to cause a voltage drop. The voltage drop caused by the resistance elements 54 to 56 is equivalent to a voltage BLC2BLX. That is, if the signals S1 to S3 are placed into the off state, a potential difference equivalent to the voltage BLC2BLX occurs between the signal BLX and the signal BLC.

In contrast, when the signals S1 to S3 are all placed into an on state, the current $I_{58}$ flows through the MOS transistors 51 to 53. Thus, no potential difference occurs between the node N11 and the node N14, and the signal BLC=the signal BLX.

In the mirror circuit 58, if the current $I_{58}$ flows through the MOS transistors 58-1 to 58-25, the current $I_{58}/50$ flows through each MOS transistor.

One end of the resistance element 57 is connected to a node N15 (to the sources of the MOS transistors 58-1 to 58-25). The other end of the resistance element 57 is connected to CELSRC.

1-3. <Sense Amplifier 5>

As shown in FIG. 16, the sense amplifier 5 according to the present embodiment corresponds to the first embodiment which dispenses with the select circuit 50 and in which the MOS transistor 34 is connected to one end of the current path in the MOS transistor 37. As shown in FIG. 16, one end of the current path in the MOS transistor 23 is connected to SCOM. The other end of the current path is supplied with the voltage VHSA (=the voltage VDD). A gate of the MOS transistor 23 is supplied with the signal BLX=(a voltage (Vblc+CELSRC+Vth23+BLC2BLX) or a voltage (Vblc+CELSRC+Vth23)).

According to the present embodiment, the signal BLX=the voltage (Vblc+CELSRC+Vth23). Thus, during "1" data read according to the present embodiment, the potential of SCOM is equal to a voltage (Vblc+CELSRC).

A case with the signal BLX=the voltage (Vblc+CELSRC+Vth23+BLC2BLX) will be described in connection with a ninth embodiment.

As described above, the signal BLC=(Vblc+Vth22 CELSRC) and the signal XXL=(Vblc+Vth25+BLC2BLX+BLX2XXL+CELSRC). The voltage CELSRC is added to the signal BLC, the signal BLX, and the signal XXL in order to maintain the potential between the gate and source of each of the corresponding MOS transistors 22, 23, and 25, that is, a value Vgs. Specific description will be given below.

During read, if the voltage CELSRC is supplied to the source SL and if the NAND string 10 is made electrically continuous (the read target memory cell MC is turned on), the potential of the bit line BL is set to the voltage CELSRC. That is, compared to the case where a voltage VSS (0 V) is supplied to the source SL, the potential of the bit line BL increases by the value of the voltage CELSRC.

As a result, for example, when the signal BLC=Vblc+Vth22) and the source potential is equal to the voltage CELSRC, the value Vgs of the MOS transistor 23 decreases by the value of CELSRC compared to the case where the voltage VSS (0 V) is supplied to the source SL. To prevent the value Vgs from varying depending on the voltage applied to the source SL, the voltage CELSRC is added to the value of the signal BLC. The same reason also applies to the signal BLX and the signal XXL.

As is the case with the above-described embodiment, one end of the current path in the MOS transistor 25 is connected to the node SCOM. The other end of the current path is connected to SEN (detector). A gate of the MOS transistor 25 is supplied with the signal XXL=(Vblc+Vth25+BLC2BLX+BLX2XXL). Here, not only the voltage relationship "signal BLC<signal BLX<signal XXL" but also the voltage relationship "signal BLC=signal BLX<signal XXL" is established between the signal BLC and the signal BLX and the signal XXL.

This is because to allow "1" data to be sensed, a larger current is passed through the MOS transistor 25 than through the MOS transistor 23 to preferentially deliver the potential of the node SEN through the bit line BL as described above. Furthermore, the same threshold is set for both the MOS transistor 22 and the MOS transistor 23 so that Vth22=Vth23.

Additionally, the gate of the MOS transistor 34 is supplied with a signal with a magnitude of a voltage (VDD+Vth31+Vα). One end of the current path in the MOS transistor 34 is supplied with the voltage VDD.

The voltage VDD is transferred by the voltage generator 6. During read, SEN is supplied with the voltage VDD via the MOS transistors 34, and 30 to get ready for charge sharing.

2. Upper Limit Value of Potential of CELSRC

Figure 17:
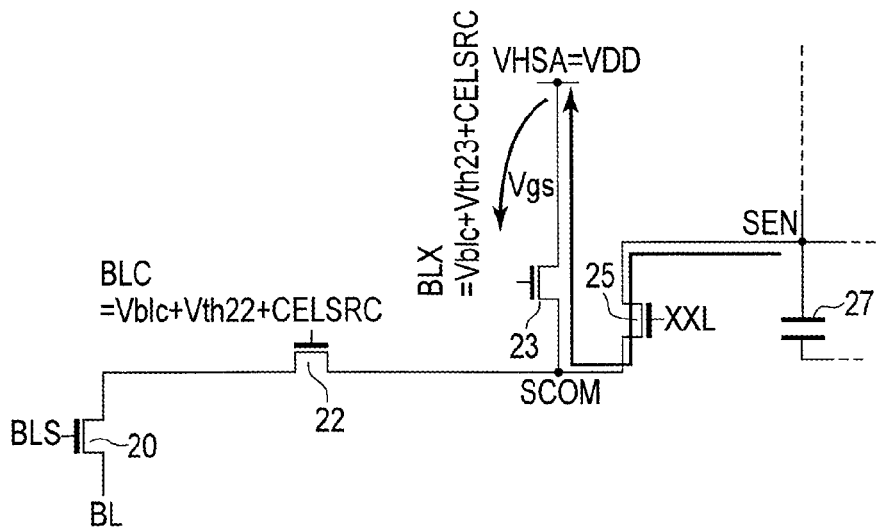
FIG. 17 is a conceptual drawing of an upper limit for CELSRC according to a third embodiment.

Now, the upper limit of the voltage V1 supplied to CELSRC will be described with reference to FIG. 17. FIG. 17 shows a part of the MOS transistors forming the sense amplifier 5 in FIG. 16.

As described above, according to the present embodiment, the voltage generator 6 raises the potential of CELSRC to shift a determination threshold toward the negative side, thus allowing data distributed on the negative side to be read. This read operation increases the values of the signal BLX and the signal BLC. The upper limit for CELSRC will be described with reference to the potential between the gate and source of the MOS transistor 23, that is, Vgs.

One end of the current path in the MOS transistor 23 is supplied with the voltage VDD, and thus the value Vgs of the MOS transistor 23 is BLX−VHSA=(Vblc+Vth23+CELSRC)−VDD. When the value Vgs exceeds the threshold Vth23 of the MOS transistor 23, the MOS transistor 23 is constantly on, causing erroneous reads (that is, charge flows in the direction of an arrow during charge sharing). To prevent this, that is, to keep the MOS transistor 23 off, Vgs and Vth23 satisfy the following expression (1) to allow charge to be prevented from moving in the direction of an illustrated arrow.

$$Vgs \leq Vth23 \quad (1)$$

Hence, based on Expression (1), the upper limit value of the voltage V1 supplied to CELSRC in order to keep the MOS transistor off is expressed by:

$$CELSRC \leq VDD - Vblc \quad (2)$$

Therefore, the upper limit value of the voltage V1 supplied to CELSRC is equal to the voltage (VDD−Vblc).

3. Conceptual Drawing Showing the Operation of the Voltage Switching Circuit 6-1 and the Sense Amplifier 5 During Read Now, the operation of the voltage switching circuit 6-1 and the sense amplifier 5 during a read operation (specifically, a precharge operation) will be described with reference to FIG. 18. Here, a part (MOS transistors 20, 22, and 23) of the configuration of the sense amplifier 5 is shown, with the remaining part of the configuration omitted.

Figure 18:
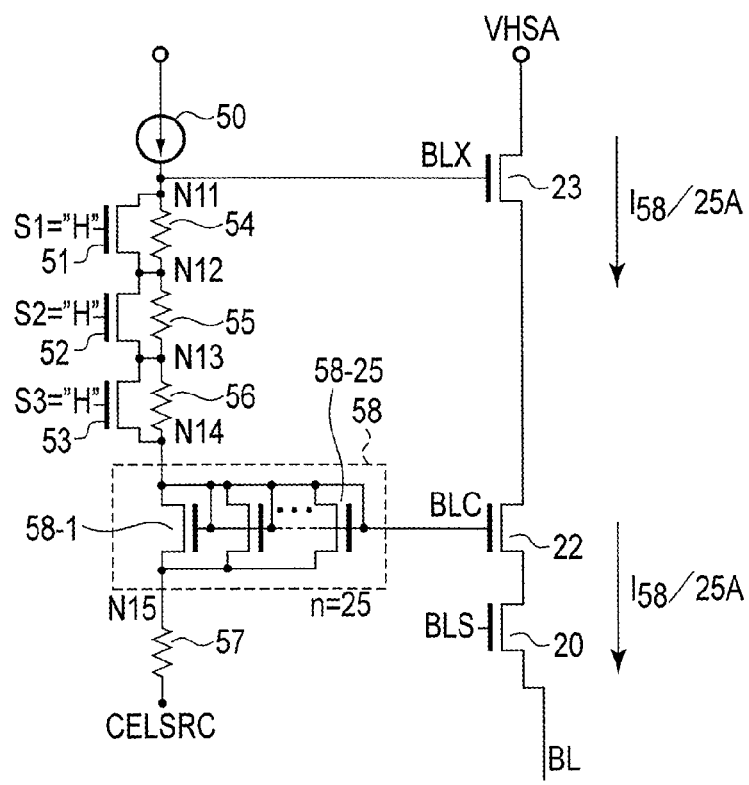
FIG. 18 is a conceptual drawing of a read operation according to the third embodiment.

As shown in FIG. 18, according to the present embodiment, the controller 4 makes, during a precharge operation, each of the signals S1 to S3 to the "H" level to turn on the MOS transistors 51 to 53.

That is, the current source 50 supplies the current $I_{58}$ to the mirror circuit 58 via the MOS transistor 51 to 53. Thus, the node N11 has the same potential as that of the node N14, that is, the signal BLX=the signal BLC. Since the mirror circuit 58 is formed of the 25 MOS transistors 58-1 to 58-25, the MOS transistors 22 and 23 pass the current $I_{58}/25$ through the bit line BL to precharge the bit line as described above. This is shown in FIG. 19, described below.

4. Time Chart Showing a Read Operation

Now, a read operation will be described with reference to FIG. 19. FIG. 19 is a timing chart showing variations in the signal BLX, the signal BLC, CELSRC, the bit line BL, the node SEN, the clock CLK, and the signal XXL.

Figure 19:
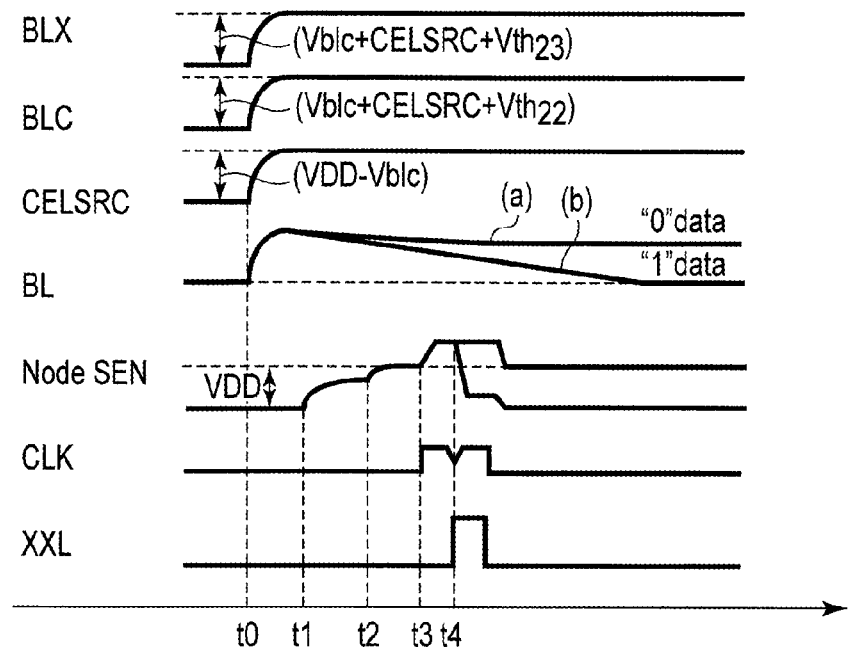
FIG. 19 is a timing chart of the read operation according to the third embodiment.

As shown in FIG. 19, at time t0, the voltage switching circuit 6-1 raises the potential of the signal BLX to the voltage (Vblc+CELSRC+Vth23), and also raises the potential of the signal BLC to a voltage (Vblc+CELSRC+Vth22).

Furthermore, at time t0, the voltage generator 6 raises the potential of CELSRC to the voltage (VDD−Vblc).

Thus, at the same time t0, precharging of the bit line BL is started, and the potential of the bit line BL rises to the voltage Vblc. Furthermore, at time t0, the potential of CELSRC rises and subsequently reaches the voltage V1 (=VDD−Vblc).

Subsequently, at time t1, the MOS transistors 34, 37, and 30 are turned on to raise the potential of the node SEN. Then, at time t3, the potential of the node SEN reaches the voltage VDD.

Then, although not shown in the drawings, after the potential of the bit line BL rises, the row decoder 2 transfers the read voltage (Vcgr (for example, 0 V) and Vread) to the word line WL.

As a result, for example, if the read target memory cell MC holds "0" data, the NAND string 10 is made electrically discontinuous (line (a) in FIG. 19), and the bit line BL maintains the voltage VDD. In contrast, if the memory cell MC holds "1" data, the NAND string is made electrically continuous (line (b) in FIG. 19) to reduce the potential of the bit line BC to the potential of CELSRC.

Furthermore, at time t3, the controller 4 sets the clock CLK to the "H" level to make the potential of the node SEN equal to the voltage (VDD+Vblc+BLC2BLX).

Then, at time t4, the controller 4 places the signal XXL into the on state to perform a sense operation. Thus, the node SEN and the node SCOM carry out charge sharing as required, allowing data read to be performed. That is, charge sharing occurs because the potential of the bit line BL has dropped as shown by the line (b). At time t4, the potential of the node SEN is set to the "L" level. As a result, the sense amplifier 5 reads "1" data.

In contrast, for the line (a), the potential of the bit line BL is prevented from dropping, thus keeping the potential of the node SEL at the "H" level. Consequently, no charge sharing occurs, and the potential of the node SEN is equal to the voltage (VDD+Vblc+BLC2BLX).

<Effects of the Third Embodiment>

The semiconductor memory apparatus according to the third embodiment may exert effects (7) to (9).

(7) A Threshold of the Memory Cell Positioned or the Negative Side May be Read.

The semiconductor memory apparatus according to the present embodiment enables the upper limit value for CELSRC to be increased by setting the value of the signal BLX equal to the value of the signal BLC. Specifically, as described above, the upper limit value for CELSRC may be set equal to the voltage (VDD−Vblc). This effect will be described with reference to a comparative example. The same components in the comparative example as the corresponding components of the present embodiment are denoted by the same reference numerals.

During a read operation, the semiconductor memory apparatus according to the comparative example establishes the relationship "signal BLX (voltage (Vblc+Vth23+CELSRC+BLC2BLX)>signal BLC (voltage (Vblc+Vth22+CELSRC) in order to sufficiently precharge the bit line BL.

This is because, for example, if the signal BLX<the signal BLC, the precharged voltage is limited to the value of the signal BLX. That is, however large value the signal BLC has, the voltage is precharged only up to the value attributed to the signal BLX.

However, setting the signal BLX>the signal BLC results in setting of a small upper limit value for CELSRC.

In contrast, the semiconductor memory apparatus according to the present embodiment allows the upper limit value for CELSRC to be increased by the value by which the potential of the signal BLX has been reduced, that is, by the value of the voltage BLC2BLX. This is because the signal BLX=the signal BLC is set.

(8) The Effect (1) May be Satisfied with the Precharge Potential Maintained.

In the semiconductor memory apparatus according to the present embodiment, if the signal BLX=the signal BLC is set, the length of the channel through which the current $I_{58}$ flows is double the channel length in the above-described comparative example because the MOS transistor 23 and the MOS transistor 22 have the same transistor size.

Thus, the present embodiment halves the number of the MOS transistors forming the mirror circuit 58 to increase the value of a current passed through each MOS transistor. That is, the present embodiment sets n=25 to allow a current with a value of $I_{58}/25$ to flow through the MOS transistor 22.

In the configuration according to the comparative example, the signal BLX>the signal BLC, and thus the current driving force $I_{f23}$ of the MOS transistor 23 is greater than the current driving force $I_{f22}$ of the MOS transistor 22.

Hence, the current value to be set by precharging may have a magnitude depending on the channel length in the MOS transistor 22. Therefore, the configuration according to the comparative example has a channel length half that in the present embodiment. Thus, the mirror circuit 58 may pass the current $I_{58}$ through 50 MOS transistors.

If this configuration is applied to the present embodiment without any change, the value of a current flowing through the bit line BL during precharging decreases to half because the channel length in the present embodiment is double the channel length in the comparative example.

Thus, the precharging potential is maintained by halving the number of the MOS transistors forming the mirror circuit 58 and increasing the current value per MOS transistor as described above. For example, during "0" data read, the potential of SCOM may be kept at a larger value, enabling a reduction in erroneous reads.

(9) A Variation in the Threshold of the MOS Transistor 22 May be Suppressed.

As described in the effect (8), in the configuration according to the present embodiment, the mirror circuit 58 is formed of the 25 MOS transistors 58-1 to 58-25. Thus, the value of a current flowing through each of the MOS transistors 58-1 to 58-25 is double the value of a current flowing through each MOS transistor forming the mirror circuit 58 in the comparative example. That is, since each of the signal BLX and the signal BLC has a magnitude twice as large as the magnitude in the comparative example, even if the threshold of the MOS transistor 22 varies slightly, the adverse effects of the variation may be reduced.

Fourth Embodiment

Figure 20:
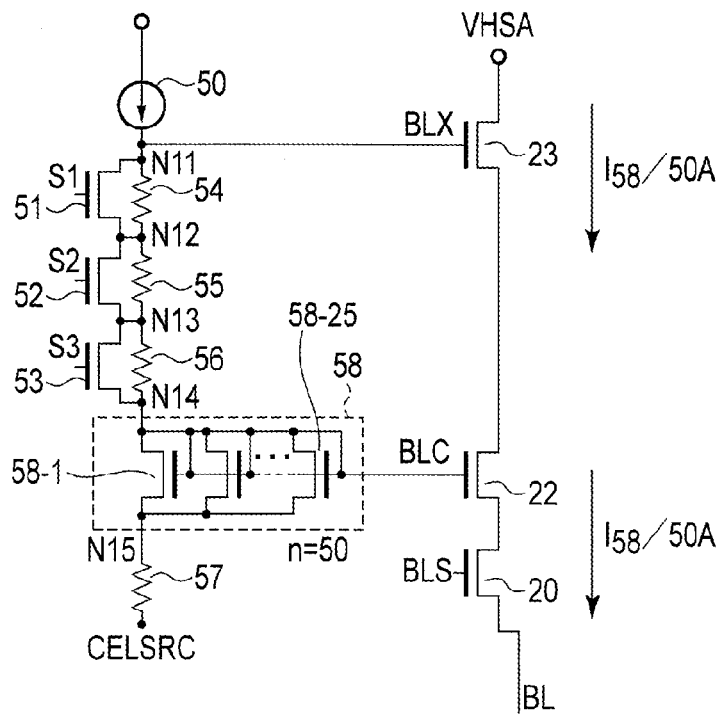
FIG. 20 is a conceptual drawing of a read operation according to a fourth embodiment.

Now, a semiconductor memory apparatus according to a fourth embodiment will be described with reference to FIG. 20 and FIG. 21. The semiconductor memory apparatus according to the fourth embodiment sets the signal BLX>the signal BLC when precharging the bit line BL, and switches the setting to the signal BLX=the signal BLC after the bit line BL is charged. The same components of the fourth embodiment as the corresponding components of the third embodiment will not be described below.

1. Exemplary Configuration 1-1. Control Section 4

The controller 4 according to the present embodiment controllably turns on and off the signals S1 to S3 supplied to the MOS transistors 51 to 53 forming the voltage setting circuit 6-1 during each of a precharge period and a sense period.

Specifically, during the precharge period, the signal BLX>the signal BLC is set by placing the signals S1 to S3 into the off state. That is, the signal BLX is set to have a potential higher than the potential of the signal BLC by the value of the voltage BLC2BLX.

1-2. Voltage Switching Circuit 6-1

The voltage switching circuit 6-1 according to the present embodiment will be described with reference to FIG. 20. In the voltage switching circuit 6-1 according to the present embodiment, the number of the MOS transistors forming the mirror circuit 58 is 50 (n=50).

It is hereinafter assumed that the mirror circuit 58 is formed of MOS transistors 58-1 to 58-50. Then, a current $I_{58}/50$ flows through each of the MOS transistors.

Furthermore, when the controller 4 places the signals S1 to S3 into the off state, a potential difference occurs between the node N11 and the node N14. That is, as described above, the node N11 has a potential greater than the potential of the node N14 by the value of the voltage BLC2BLX. Namely, the signal BLX (the voltage (Vblc+Vth23+CELSRC+BLC2BLX)) is supplied to the MOS transistor 23.

2. Time Chart Showing a Read Operation

Now, a read operation according to the fourth embodiment will be described with reference to FIG. 21. The same portions of the operation according to the fourth embodiment as the corresponding portions in the third embodiment will not be described. FIG. 21 is a timing chart showing variations in the signal BLX, the signal BLC, CELSRC, the bit line BL, the node SEN, the clock CLK, and the signal XXL.

As shown in FIG. 21, at time t3, the value of the signal BLX is switched from the voltage (Vblc+CELSRC+Vth23+BLC2BLX) to the voltage (Vblc+CELSRC+Vth23).

Specifically, at time t3, the controller 4 switches the signals S1 to S3 from the off state to the on state. That is, at and after time t3, the signal BLX=the signal BLC. This prevents possible erroneous read even with the same upper limit value for CELSRC as that in the third embodiment.

<Effects of the Fourth Embodiment>

The semiconductor memory apparatus according to the fourth embodiment may exert an effect (10) described below in addition to the effect (7) described above.

(10) The Adverse Effects of a Variation in the Threshold of the MOS Transistor 23 May be Suppressed without the Need to Reduce the Upper Limit Value for CELSRC.

The effect (10) will be described. The semiconductor memory apparatus according to the present embodiment keeps the value of the signal BLX larger than the value of the signal BLC by time t3, that is, during the charging period for the bit line BL. This enables a reduction in a variation in the threshold of the MOS transistor 23, which varies among the sense amplifiers 5, and thus in a variation in the precharge current supplied to the bit line BC.

Furthermore, the semiconductor memory apparatus according to the present embodiment may also set the potential supplied to CELSRC to the voltage (VDD−Vblc) by reducing the value of the signal BLX by the value of the voltage drop at the resistance elements 54 to 57 immediately before sensing, that is, immediately before the signal XXL is placed into the on state. That is, a threshold may be read from the negative side of the threshold distribution of the memory cell MC, as is the case with the third embodiment.

Fifth Embodiment

Now, a semiconductor memory apparatus according to the fifth embodiment will be described with reference to FIG. 22 and FIG. 23. The semiconductor memory apparatus according to the fifth embodiment switches the number n of the MOS transistors forming the mirror circuit 58 to 50=>25 at the time of the sense operation according to the fourth embodiment. The same components of the fifth embodiment as the corresponding components of the third and fourth embodiments will not be described, and different components will be described.

1. Configuration 1-1. Voltage Switching Circuit 6-1

The voltage switching circuit 6-1 according to the fifth embodiment will be described with reference to FIG. 22. As shown in FIG. 22, the voltage switching circuit 6-1 comprises MOS transistors 59-1 and 59-2 and resistance elements 57-1 and 57-2. According to the present embodiment, the mirror circuit 58 comprises a mirror section 58-1 and a mirror section 58-2. A configuration of the voltage switching circuit 6-1 will be described below.

The mirror section 58-1 comprises the MOS transistors 58-1 to 58-25 each including a drain and a gate both connected to the node N14 and a source connected to one end of the current path in the MOS transistor 59-1. A gate of the MOS transistor 59-1 is supplied with a switch SW<0>. A source of the MOS transistor 59-1 is connected to one end of the resistance element 57-1.

Furthermore, the mirror section 58-2 comprises the MOS transistors 58-26 to 58-50 each including a drain and a gate both connected to the node N14 and a source connected to one end of the current path in the MOS transistor 59-2. A gate of the MOS transistor 59-2 is supplied with a switch SW<1>. A source of the MOS transistor 59-2 is connected to one end of the resistance element 57-2.

That is, the number of the MOS transistors forming the mirror circuit 58 is set to be varied by turning on and off the switches SW<0> and SW<1>.

As described above, for n=25, the current $I_{58}/25$ flows through the MOS transistor 22. For n=50, the current $I_{58}/50$ flows through the MOS transistor 22.

2. Time Chart Showing a Read Operation

Now, a read operation according to the fifth embodiment will be described with reference to FIG. 23. FIG. 23 is a timing chart showing variations in the switch SW<0>, the switch SW<1>, the signal BLX, the signal BLC, CELSRC, the bit line BL, the node SEN, the clock CLK, and the signal XXL. Portions of the operation according to the fifth embodiment which are different from the operation according to the third and fourth embodiments will be described. The same portions of the operation will not be described.

As shown in FIG. 23, at time t0, each of the switches SW<0> and SW<1> is set to the "H" level. That is, the 50 MOS transistors 58-1 to 58-50 allow the constant current $I_{58}$ to flow therethrough. Namely, the current $I_{58}/50$ is passed through the MOS transistor 23.

Subsequently, at time t3, the switch SW<1> is set to the "L" level to configure the mirror circuit 58 at n=25. That is, the 25 (=n) MOS transistors 58-1 to 58-25 allow the constant current $I_{58}$ to flow therethrough. Namely, at and after time t3, the current $I_{58}/25$ is passed through the MOS transistor 23.

<Effects of the Fifth Embodiment>

The semiconductor memory apparatus according to the fourth embodiment may exert an effect (11) described below in addition to the effects (7) to (10) described above.

(11) Erroneous Data Reads May be Suppressed.

At time t3, the semiconductor memory apparatus according to the fifth embodiment sets the signal BLX=the signal BLC and changes the number of the MOS transistors through which the constant current $I_{58}$ flows from 50 to 25. Thus, the value of the current $I_{58}$ flowing through the MOS transistor 23 may be saved after time t3.

That is, if the number n remains 50 after t3, the value of the current flowing through the MOS transistor 23 is halved as described in the comparative example referenced in <Effects of the third embodiment. Then, for example, the potential of the bit line BL through which "1" data is to be read may decrease rapidly at and after t3.

This is because a current flowing toward CELSRC is larger than the current $I_{58}/50$ flowing through the MOS transistor 23. Accordingly, the potential of, for example, the adjacent bit line BC through which "0" data is to be read may be dropped by capacitive coupling. As a result, the potential of SCOM may decrease, causing erroneous read during sensing.

However, the semiconductor memory apparatus according to the fifth embodiment may save, at time t3, the value of the current $I_{58}$ flowing through the MOS transistor 23 as described above. This enables erroneous reads to be suppressed.

Sixth Embodiment

A semiconductor memory apparatus according to a sixth embodiment detects the potential of the well in which the memory cell MC is formed and accelerates the potential of CELSRC at the optimum speed. The sixth embodiment will be described with reference to FIG. 24 to FIG. 27.

1. Configuration

An exemplary general configuration of the semiconductor memory apparatus according to the present embodiment will be described with reference to FIG. 24. The same components of the present embodiment as the corresponding components of the above-described embodiments will not be described below.

1-1. Controller 4

The controller 4 shown in FIG. 24 detects the voltages of the well and the source line SL and controls, for example, a timing to supply a signal to each of the transistors forming a source line SL driver 7.

The configuration will be described below, but the controller 4 according to the present embodiment comprises a voltage control circuit 4-1. The voltage control circuit 4-1 has a function to charge and discharge the potentials of the well and the source line SL and to detect the potentials of potential of the source line SL. The voltage control circuit 4-1 is also controlled by the controller 4.

1.2 Voltage Generator 6

The voltage generator 6 shown in FIG. 24 receives an external voltage (voltage Vcc, for example, 1.8 V) to generate a predetermined voltage in accordance with the controller 4. Specifically, the voltage generator 6 generates and supplies the read voltage Vcgr, the voltage Vread, and the erase voltage Vera and supplies an external voltage to each component without any change as an internal voltage VDD.

The voltage VDD is supplied to the source line driver 7, and the read voltage Vcgr, the voltage Vread, the erase voltage Vera, and the like are transferred to the word line WL via the row decoder 2 as is the case with the above-described embodiments.

The voltage generator 6 according to a ninth embodiment described below is configured to generate the voltage VX2 based on the external voltage Vcc.

1-3. Sense Amplifier 5

Now, the sense amplifier 5 according to the sixth embodiment will be described with reference to FIG. 25. As shown in FIG. 25, the sense amplifier 5 according to the sixth embodiment corresponds to the sense amplifier 5 according to the first embodiment which dispenses with the select circuit 50 and in which the MOS transistor 34 is connected to one end of the current path in the MOS transistor 37 and which further includes the MOS transistors 21, 24, and 26. Only differences from the above-described embodiments will be described.

1-3-1. Exemplary Configuration

As shown in FIG. 25, one end of the current path in the MOS transistor 21 is connected to a node N20. The other end of the current path is grounded (VLSA). A gate of the MOS transistor 21 is supplied with the signal BLV.

One end of the current path in the MOS transistor 23 is connected to SCOM. The other end of the current path is connected to one end of the MOS transistor 24. A gate of the MOS transistor 23 is supplied with the signal BLX=the voltage (Vblc+CELSRC+Vth23+BLC2BLX). The voltage BLC2BLX is a guard band voltage which is effective for transferring the voltage VDD to SCOM and for increasing the current driving force of the MOS transistor 23 above the current driving force of the MOS transistor 22.

The other end of the current path in the MOS transistor 24 is supplied with the voltage VHSA (=the voltage VDD). A gate of the MOS transistor 24 is supplied with a signal INV. The MOS transistor 24 may be omitted.

The configuration will further be described. One end of the current path in the MOS transistor 26 is connected to SCOM. The other end of the current path is grounded (voltage SRCGND). A gate of the MOS transistor 26 is supplied with the signal INV.

Now, with reference to FIG. 26, a detailed configuration of the voltage control circuit 4-1 and the source line SL driver 7 will be discussed. Furthermore, the connective relationship between the voltage control circuit 4-1 and the source line SL driver 7 and the sense amplifier 5 will also be described.

2. Conceptual Drawing Showing a Detailed Configuration of the Voltage Control Circuit 4-1 and the Source Line SL Driver 7 and the Connections Between the Voltage Control Circuit 4-1 and the Source Line SL Driver 7 and the Sense Amplifier 5

First, a configuration of a part of the memory cell array 1, the source line SL driver 7, and the voltage control circuit 4-1 is shown in FIG. 26.

2-1. Source Line SL Driver 7

The source line SL driver 7 according to the present embodiment has a function to boost or discharge the potential of the source line SL, that is, the voltage of CELSRC during data read. As shown in FIG. 26, the source line SL driver 7 comprises n-channel type MOS transistors 72 to 76. One end of the current path in the MOS transistor 72 is connected to the source line SL at the node N20 (CELSRC). The other end of the current path is grounded. A gate of the MOS transistor 72 is supplied with the signal GSRCDRV output by SRCAMP_PD61. The potential at the node N20 is denoted by $V_{CEL}$.

One end of the current path in the MOS transistor 73 is connected to the node N20. The other end of the current path is connected to a node N21 (CPWELL). A gate of the MOS transistor 73 is supplied with a signal S10.

One end of the current path in the MOS transistor 74 is connected to the node N21 (CPWELL). The other end of the MOS transistor 74 is grounded. A gate of the MOS transistor 74 is supplied with a signal S11. The potential at the node N21 is denoted by $V_{CP}$.

One end of the current path in the MOS transistor 75 is connected to the node N20. The other end of the current path is connected to a node N22 (SRCGND). A gate of the MOS transistor 75 is supplied with a signal S12. Furthermore, one end of the current path in the MOS transistor 76 is connected to the node N22. The other end of the MOS transistor 76 is grounded. A gate of the MOS transistor 76 is supplied with a signal S13. The potential of SRCGND is denoted by $V_{SRC}$.

Here, the signals S10 to S13 are supplied by the controller 4. That is, the controller 4 turns on and off the MOS transistors 73 to 75.

2-2. Voltage Controller 4-1

As shown in FIG. 26, the voltage control circuit 4-1 according to the sixth embodiment comprises SRCAMP_PD61, SRCBOOT62, SRCRPE63, SRCKEEP64, SRCDTCT65, SRCBOOT_ACC66, BLDR67, and DREFF68.

SRCCAMP_PD61 according to the present embodiment compares VREF_SRC with the potential (hereinafter referred to as the voltage SRC_MON_T) of the source line SL arranged in the block BLKs (s is, for example, 1,023). SRCCAMP_PD61 outputs the signal GSRCDRV configured to adjust the discharge capability of the MOS transistor 72.

SRCAMP_PD61 has a function to make a potential to be provided to CELSRC during read almost equal to VREF_SRC. That is, for example, when the voltage SRC_MON_T exceeds VREF_SRC, SRCAMP_PD61 outputs the signal GSRCDRV at the "L" level to discharge the potential of CELSRC. Here, VREF_SRC has the same value as that of the voltage to be provided to CELSRC during read. SRCAMP_PD61 also has a function to compare VREF_SRC with the potential (hereinafter referred to as the voltage SRC_MON_B) of the source line SL arranged in the block BLK0. However, the present embodiment does not use this function and thus omits the description of the function.

An output from SRCBOOT62 is connected to the node N22. Based on the voltage VDD supplied by the voltage control circuit 4-1, SRCBOOT62 generates a voltage V1 (for example, 1 V) to boost the potential of CELSRC to, for example, about 1.0 V via the node N22 and the MOS transistor 75.

An output from SRCPRE63 is connected to the node N20. Like SRCBOOT62, SRCPRE63 boosts the potential of CELSRC to, for example, about 1.0 V based on the voltage VDD supplied by the voltage control circuit 4-1.

An output from SRCKEEP64 is connected to the node N22. SRCKEEP64 has a function to keep CELSRC at a predetermined voltage based on the voltage VDD supplied by the voltage generator 6. The predetermined voltage is, for example, a voltage (about 1.0 V) supplied to the source of the memory cell MC in order to read negative-side data from the memory cell MC.

SRCDTCT 65 according to the present embodiment detects the potential of the node N21. When the result of the detection indicates that the potential of the node N21 exceeds a predetermined voltage, SRCDTCT65 controls an output from SRCBOOT62 to the "L" level. That is, upon detecting an overshoot of the voltage of the node N21, SRCDTCT65 allows SRCBOOT62 to stop raising the voltage. The reason for the detection of the potential of the node N21 will be discussed.

For example, if SRCDTCT65 detects the potential of the node N20, a charging path from SRCBOOT62 and SECPRE63 includes the node N20, the MOS transistor 73, and the node N21 in this order. Thus, for example, even when potential of the node N20 exceeds a predetermined value, the potential of the node N21 does not necessarily also exceed the predetermined value.

In fact, when SRCBOOT 62 and SRCPRE63 stop output, charge sharing occurs between the node N20 and the node N21 with the MOS transistor 73 kept on. Consequently, the potential of the node N20 having risen to the predetermined voltage drops. Hence, the potential of the node N21 is considered to be a reference. That is, when the potential of the node N21 is considered to be a reference, the potential of the node N is prevented from being equal to or lower than the predetermined value even with possible charge sharing. Thus, the present embodiment detects the potential of the node N21.

SRCBOOT_ACC66 increases the speed at which the voltage is output by SRCPRE63, that is, the voltage rising speed. Like SRCDTCT65, SRCBOOT_ACC66 controllably makes the output from SRCPRE63 low when the potential of the node N21 (CPWELL) reaches a predetermined value.

BLDR67 controls the signal level of each of the signal BLC, the signal BLX, and the signal XXL, for example, during read. Specifically, for example, during read, BLDR67 sets the signal BLC, the signal BLX, and the signal XXL to the "H" level to precharge the bit line BC. DREFF68 has a function to BLDR67.

As shown in FIG. 26, the node of the source line SL in the block BLK0 is denoted by SRC_MON_B. The node of the source line SL in the block BLKs is denoted by SRC_MON_T. The length of a interconnect from SRC_MON_B to the node N20 is denoted by L1 (interconnect capacity C1). The length of a interconnect from SRC_MON_T to the node N20 is denoted by L2 (>L1, a interconnect capacity C2>C1). That is, the block BLK0 is positioned close to the source line SL driver 5 so that the voltage is fed from the source SL side of the block BLK0 toward the source line SL in the block BLK1023.

3. Read Operation

Now, a timing chart of the node N20 (CELSRC), the node N21 (CPWELL), the node N22 (SRCGND), the bit line BL, the signal BLC, the signal level of the signal BLX, a voltage IBLC, the signal GSRCDRV, and the signals 10 to 13 during a read operation will be described with reference to FIG. 27. Here, the voltage IBLC refers to a voltage supplied to the MOS transistors 22, 23, and 25.

As shown in FIG. 27, at time t0, the controller 4 sets each of the signals S11 and S13 to the "H" level to turn on each of the MOS transistors 74 and 76. This allows the potentials of the node N21 and the node N22 to be reset (to the ground potential). The boosted potential of, for example, the node N21 needs to be detected, and thus the node N21 is preset to the ground potential.

Furthermore, at the same time t0, DREFF68 allows BLDR67 to output the voltage IBLC to the sense amplifier 5. In response, the MOS transistors 22, 23, and 25 start precharging the bit line BL. That is, at time t1, the signal BLC and the signal BLX rise, and the MOS transistors 22, 23, and 25 then raise the potential of the bit line BC.

Moreover, at time t1, SRCBOOT62 and SRCPRE63 output predetermined voltages. Thus, at time t1, the potentials of the node N20 and the node N22 rise.

Then, at time t2, the controller 4 sets each of the signal S10 and the signal S12 to the "H" level. That is, the MOS transistors 73 and 75 are turned on to make the node N20 to the node N22 electrically continuous.

Thus, at time t2, the potential of the node N rises via the MOS transistors 75 and 73. Although not shown in the drawings, SRCKEEP64 continues to supply a slight current to the node N22 after t2.

Subsequently, at time t3, the potential of the node N20 exceeds a predetermined value (for example, 1 V). Then, at time t4, the potential of the node N21 also exceeds the predetermined value (for example, 1 V).

Furthermore, at time t3, the potential of the node N20 exceeds the predetermined value, and thus SRCAMP_PD61 raises the signal GSRCDRV. That is, the MOS transistor 72 is turned on to discharge the raised potential of the node N20. At time t4, the potential of the node N21 exceeds the predetermined value, and thus SRCDRCR65 allows SRCBOOT62 and SRCPRE63 to stop output.

Subsequently, the potential of CELSRC continues to overshoot, and at time t4, reaches its peak. After time t5, CELSRC maintains a constant, stable voltage. Then, the bit line BL also overshoots, and after t6, maintains a constant voltage.

Furthermore, at time t7, when the signals S10 and S12 are set to the "L" level, the potentials of the node N21 and the node N23 drop to a zero potential.

<Effects of the Sixth Embodiment>

The semiconductor memory apparatus according to the sixth embodiment may exert effects (12) and (13).

(12) The Potential of the Node N20 May be Quickly Raised.

That is, the semiconductor memory apparatus according to the sixth embodiment comprises SRCPRE63 in addition to SRCBOOST62. The potential of the node N20 may be quickly raised by using outputs from SRCBOOT62 and SRCPRE63 to increase the current driving force.

(13) The Potential of the Node N20 May be Quickly Converged to a Set Voltage.

That is, in the semiconductor memory apparatus according to the sixth embodiment, SRCDTCT65 is configured to detect the potential of the node N21. The effects of the configuration according to the sixth embodiment will be described with reference to a comparative example. As described above, if SRCDTCT65 is configured to detect the potential of the node N20, SRCDTCT65 controllably sets the output from SRCBOOT62 to the "L" level after the node N20 overshoots a predetermined value. Then, transfer occurs from the node 20 to the node N21 via the MOS transistor 73. Thus, when the node N20 overshoots, the potential of the node N21 (CP-WELL) is slightly lower than the potential of the node 20. That is, when the output from SRCBOOT 62 is controlled using the potential of the node N20 as a reference, after SRCBOOST62 stops output, charge sharing occurs between the node N20 and the node N21 due to the potential difference between the node N20 and the node N21. Namely, the potential of the node N20 drops after reaching the predetermined value. Then, after SRCBOOT62 stops output, SRCKEEP64 passes a constant current so as to set the node N20 to a given potential. However, since the current is slight, a long time is required for the potential to reach a predetermined value. That is, the potential of the node N20 repeatedly rises and drops a number of times to converge to the given voltage.

In contrast, in the configuration according to the sixth embodiment, an overshoot occurs but only once. That is, the time required for the node 20 to reach the predetermined value after overshooting is shorter than in the configuration referenced in the comparative example. This enables a quick operation to be achieved during read. For example, for a semiconductor memory apparatus with a memory capacity of 1 Gbits, the present embodiment may reduce the read time, which is 20 μs in the comparative example, by about 1 μs.

Seventh Embodiment

Now, a seventh embodiment will be described with reference to FIG. 28 and FIG. 29. A configuration according to the seventh embodiment is different from the configuration according to the sixth embodiment in that the controller 4 according to the seventh embodiment further comprises GSRC_ACC69. The operation of GSRC_ACC69 is also controlled by the controller 4.

1. Exemplary Configuration

Figure 28:
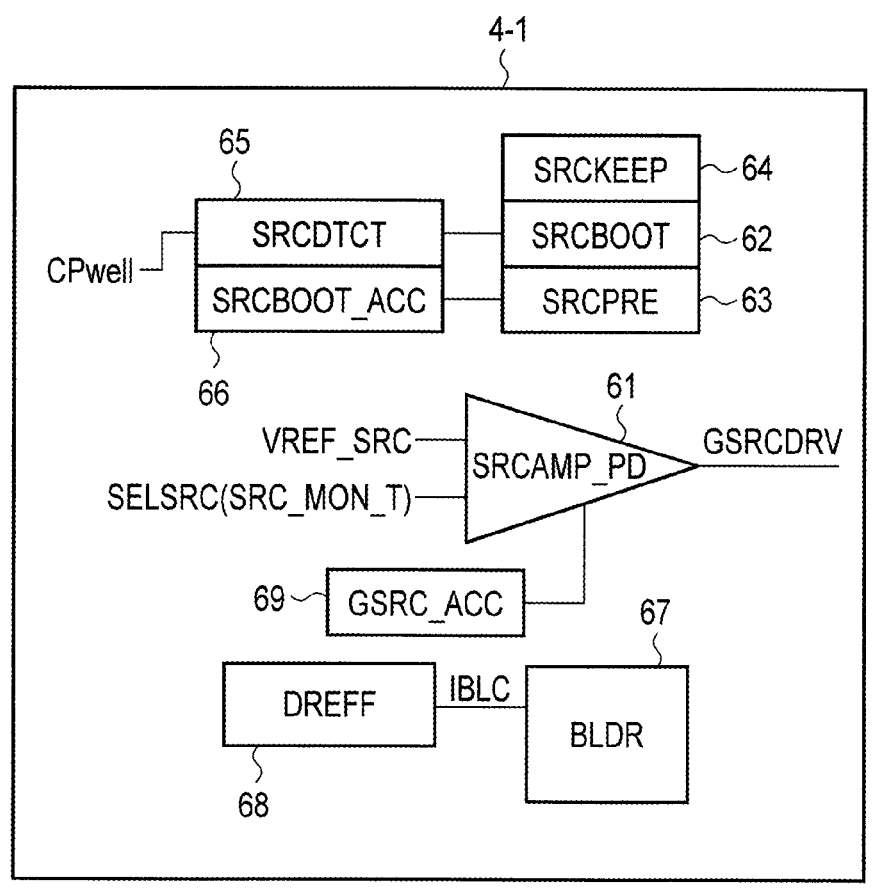
FIG. 28 is a diagram of an exemplary configuration of a controller according to a seventh embodiment.

FIG. 28 shows a configuration of the voltage control circuit 4-1. GSRC_ACC69 controls an output from SRCAMP_PD61. Specifically, GSRC_ACC69 controls the output from SRCAMP_PD61 so as to turn on the MOS transistor 72 earlier and to allow the MOS transistor 72 to transition slowly to the on state. That is, instead of turning on the MOS transistor 72 after the potential of the node N20 overshoots, the present embodiment turns on the MOS transistor 72 before the potential of the node N20 overshoots so that the MOS transistor 72 may transition slowly to the on state. Specifically, the output from SRCAMP_PD61 is controlled so that the MOS transistor 72 may transition to the on state at the moment when SRCBOOT62 and SRCPRE63 are turned on.

2. Read Operation

Now, a read operation will be described with reference to FIG. 29. The read operation according to the seventh embodiment is different from the read operation according to the sixth embodiment in the output of the signal GSRCDRV. Only the output of the signal GSRCDRV will be described below.

As shown in FIG. 29, at time t1, GSRC_ACC69 raises the output voltage of the signal GSRCDRV and keeps the signal GSRCDRV in a steady state until time t3. Then, GSRC_ACC69 raises the signal GSRCDRV up to a potential equivalent to the "H" level. In this manner, before the potentials of the node N20 and the node N21 overshoot, the MOS transistor 72 is allowed to transition slowly to the on state. Thus, after the potentials of the node N20 and the node N21 temporarily overshoot, the signal GSRCDRV is stabilized at a predetermined value at time t5' (<t5).

<Effects of the Seventh Embodiment>

The semiconductor memory apparatus according to the seventh embodiment may exert an effect (14) described below in addition to the effect (12).

(14) The Potential of the Node N20 May Further be Quickly Converged to the Set Potential.

The configuration according to the seventh embodiment further comprises GSRC_ACC69 as described above. GSRC_ACC69 may control an output from SRCAMP_ACC71. That is, the output from SRCAMP_ACC71 is controlled so as to allow the MOS transistor 72 to transition slowly to the on state; the control of the output is started before the potentials of the node N20 and the node N21 overshoot, specifically, after SRCBOOT62 and SRCPRE63 are turned on. This enables a reduction in the time required to stabilize the output from SRCAMP_ACC71 to the predetermined value after the node N20 and the node N21 overshoot.

If SRCAMP_ACC71 provides output after the node N20 and the node N21 overshoot, SRCKEEP64 continues to pass a constant current. Thus, even if a current flowing as a result of the discharge of the MOS transistor 72 is greater than the output from SRCKEEP64, a long time may be required to stabilize the values for the node N20 and the node N21.

In contrast, the configuration according to the seventh embodiment may reduce such a time to quickly achieve a read operation as a whole.

Eighth Embodiment

Now, an eighth embodiment will be described with reference to FIG. 30. The semiconductor memory apparatus according to the eighth embodiment adopts a well ground scheme of grounding the potential of the node N21, that is, setting the node N21 to the zero potential. In this case, SRCDTCT65 may not detect the potential of the node N21. Thus, the eighth embodiment further includes SRCFB_SEL70 to increase the degree of freedom so as to allow even the node N20 to detect an overshoot.

A configuration according to the eighth embodiment will be described. The same portions of the configuration of the eighth embodiment as the corresponding portions of the configurations of the sixth and seventh embodiments will not be described. The well ground scheme sets the well to the zero potential to allow a more negative threshold to be read than the first and seventh embodiments.

1. Exemplary Configuration 1-1. SRCFB_SEL70

As shown in FIG. 30, SRCFB_SEL70 may select and output the potential of either the node N21 or the node N20 to SRCDTCT65 under the control of the controller 4. Furthermore, whether SRCFB_SEL70 selects either the node N2 or the node N20 depends on whether GSRC_ACC76 is on or off and the value of a signal WELLGND. Here, the signal WELLGND indicates whether or not to adopt the well ground scheme, and at the "H" level, allows the well ground scheme to be adopted. The select signals will be described in connection with each of a plurality of modes.

Mode 1: GSRC_ACC69=on and the signal WELLGND=the "H" level

In a mode 1, SRCFB_SEL70 selects SRC_MON_B.

The reason for this selection will be discussed. The mode 1 adopts the well ground scheme and thus fails to detect the potential of the node N21. Thus, SRCFB_SEL70 detects the potential of the node N20. Here, the physical position of the node N20 will be described.

In the mode 1, no voltage is supplied to the node N21. Thus, the node N20 has a capacity reduced by an amount equivalent to the node N21 as seen from SRCBOOT62 and SRCPRE63.

That is, the voltage of the node N20 rises earlier than in the semiconductor memory apparatuses according to the first and seventh embodiments. Hence, when an overshoot is detected in the source (SRC_MON_T) positioned in the block BLK1023, the potential of the source (SRC_MON_B) positioned in the block BLK1 has already overshot. Consequently, in the mode 1, SRC_MON_B detects an overshoot.

Mode 2: GSRC_ACC69=on and the signal WELLGND="L" level

The mode 2 does not adopt the well ground scheme. Thus, SRCFB_SEL70 selects the node N21. That is, the mode 2 corresponds to the seventh embodiment.

Mode 3: GSRC_ACC69=off and the signal WELLGND=the "L" level

The present embodiment does not adopt the mode 3. Thus, the mode 3 will be described below in brief. In the mode 3, SRCFB_SEL70 selects the potential of CELSRC (SRC_MON_T). The mode 3 is a preliminary mode which is used when the modes 1 and 2 are unavailable.

1-2. SRCAMP_PD61

SRCCAMP_PD61 according to the eighth embodiment also detects the potential of CELSRC at SRC_MON_T. Thus, this will not be described. Furthermore, the present embodiment uses the same timing chart as that for the seventh embodiment. Thus, the timing chart will not be described.

<Effects of the Eighth Embodiment>

The semiconductor memory apparatus according to the eighth embodiment may also exert the above-described effects (12) and (14). That is, the semiconductor memory apparatus according to the eighth embodiment may quickly raise the potential of the node N20 and quickly converge the potential of CELSRC to the set potential. Namely, if the well ground scheme is adopted, the further provision of SRCFB_SEL70, which may detect the potential of SRC_MON_B, allows the potential of CELSRC to converge quickly to the set potential.

Ninth Embodiment

Now, a semiconductor memory apparatus according to a ninth embodiment will be described with reference to FIG. 31. The semiconductor memory apparatus according to the ninth embodiment is configured to further comprise IBLC_ACC71 in order to increase the speed at which the bit line BC is precharged for read. The configuration according to the ninth embodiment will be described below. The operation of IBLC_ACC71 is also controlled by the controller 4.

1. Exemplary Configuration 1-1. Configuration of IBLC_ACC71

A configuration of IBLC_ACC71 is shown in FIG. 32. As shown in FIG. 32, IBLC_ACC71 comprises a transfer transistor 81-1 and a level shifter 81-2. IBLC_ACC71 is turned on by the level shifter 81-2 to receive the voltage VX2 generated by the voltage generator 6, and supplies the voltage VX2 to BLDR67. The voltage VX2 has a value of, for example, about 4 V.

1-2. Configuration of BLDR67

As shown in FIG. 32, BLDR67 comprises a current source 67-1, n-channel type MOS transistors 67-2 and 67-5, resistance elements 67-3 and 67-4, and an XXL driver 67-6. The XXL driver 67-6 comprises an re-channel type MOS transistor 67-6.

An output from IBLC_ACC61 is connected to an input end of the current source 67-1. An output end of the current source 67-1 is connected to the node N4 and to one end of the current path in the MOS transistor 67-2. That is, IBLC_ACC71 supplies a voltage of, for example, 4 V to the node N4. The XXL driver is connected to the node N4. Specifically, the node N4 is connected to a gate of the n-channel type MOS transistor 67-6. One end of the current path is supplied with the voltage (Vblc+Vth25+BLC2BLX+BLX2XXL). The other end of the current path is connected to the gate of the MOS transistor 25.

One end of the resistance element 67-3 is connected to the other end of the current path in the MOS transistor 67-2. The other end of the resistance element 67-3 is connected to the gate of the MOS transistor 23 via a node N5. That is, the voltage (the signal BLX=Vblc+CELSRC+Vth23+BLC2BLX) supplied to the gate of the MOS transistor 23 is consumed by the resistance element 67-3 by an amount equal to the voltage BLX2XXL.

Furthermore, one end of the resistance element 67-4 is connected to the node N5. The other end of the resistance element 67-4 is connected to the gate of the MOS transistor 22 via a node N6. That is, the voltage (the signal BLX=Vblc+CELSRC+Vth22) supplied to the gate of the MOS transistor 23 is consumed by the resistance element 67-4 by an amount equal to the voltage BLC2BLX.

2. Read Operation

Now, a read operation according to a ninth embodiment will be described with reference to FIG. 33. FIG. 33 is a timing chart of the signal CELSRC, the signal CPWELL, the signal SRCGND, the bit line BL, the current IBLC_ACC71, the signal BLX, the signal SLC, the signal GSRCDRV, and the signal S10 to signal S13. Portions of the operation which are similar to the corresponding portions in the first and seventh embodiments will not be described.

As shown in FIG. 33, at time t0, the current source 67-1 raises the potential of the node N4. Subsequently, at time t1, an output from IBLC_ACC71 is connected to the input end of the current source 67-1. This raises the potential of the node N4 up to about 4V. Thus, the rise in potential allows the XXL driver 67-6 to drive the MOS transistor 25. As a result, the MOS transistor 25 is turned on.

Furthermore, the rise in the potentials of the node N5 and the node N6 turns on the MOS transistors 22 and 23. That is, at time t2, the potentials of the signal BLX and the signal BLC rise. In conjunction with the rising edges of the signal XXL, the signal BLX, and the signal BLC, the potential of the bit line BL rises at the same time t2 and reaches a set potential (about 4 V) at time t3. The operation of the other signals CELSRC, CPWELL, and GSRCDRV is similar to the operation in the sixth embodiment and will thus not be described.

<Effects of the Ninth Embodiment>

The semiconductor memory apparatus according to the ninth embodiment may further exert an effort (15) described below in addition to the above-described effects (12) to (14).

(15) The Potential of the Bit Line BL May be Quickly Raised.

The semiconductor memory apparatus according to the ninth embodiment further comprises IBLC_ACC71 as described above. If IBLC_ACC61 is omitted and the current source 67-1 in BLDR67 raises the potential of the node N4, the voltage rise of the MOS transistors 22, 23, and 25, which receive the signal XXL, the signal BLX, and the signal BLC, may be affected because a long time is required to raise the potential of the node N4 simply by an output from the current source 67-1. That is, a long time is required to precharge the bit line BL.

In contrast, the semiconductor memory apparatus according to the seventh embodiment comprises IBLC_ACC61, which enables a voltage of, for example, about 4 V to be supplied to the node N4. Thus, the MOS transistors 22, 23, and 25 may be quickly turned on.

Each embodiment is applicable to a three dimensional multilayered NAND flash memory.

Furthermore, a structure of the memory cell array is not limited as above description.

A memory cell array formation may be disclosed in U.S. patent application Ser. No. 12/532,030 filed on Mar. 23, 2009. U.S. patent application Ser. No. 12/532,030, the entire contents of which are incorporated by reference herein.

Furthermore A memory cell array formation may be disclosed in U.S. patent application Ser. No. 12/679,991 filed on Mar. 25, 2010. U.S. patent application Ser. No. 12/679,991, the entire contents of which are incorporated by reference herein.

Furthermore A memory cell array formation may be disclosed in U.S. patent application Ser. No. 12/406,524 filed on Mar. 18, 2009. U.S. patent application Ser. No. 12/406,524, the entire contents of which are incorporated by reference herein.

Furthermore A memory cell array formation may be disclosed in U.S. patent application Ser. No. 12/407,403 filed on Mar. 19, 2009. U.S. patent application Ser. No. 12/407,403, the entire contents of which are incorporated by reference herein.

While certain embodiments have been described, these embodiments have been presented by way of example only, and are not intended to limit the scope of the inventions. Indeed, the novel embodiments described herein may be embodied in a variety of other forms; furthermore various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first transistor configured to be capable of transferring a first voltage to a bit line;
a detector configured to read data held by a memory cell connected to the bit line; and
a second transistor configured to be capable of transferring a second voltage and a third voltage to the detector, the second voltage being generated by a source different from a source of the first voltage, the third voltage being larger than the second voltage
wherein the second transistor charges the detector to one of the second voltage and the third voltage, while the first transistor transferring the first voltage to the bit line.

2. The device according to claim 1, further comprising a selector configured to output one of the second voltage and the third voltage to the second transistor.

3. The device according to claim 2, wherein the selector includes a third transistor, the third transistor outputting one of the second voltage and the third voltage to the second transistor, and
the third transistor is an n-channel type MOS transistor.

4. The device according to claim 1, further comprising:
a third transistor with a current path one end of which is connected to one end of a current path in the first transistor, the third transistor being enable to transfer the voltage of the detector to the bit line; and
a fourth transistor with a current path one end of which is connected to the one end of the current path in the first transistor and to one end of the current path in the third transistor, the fourth transistor clamping the bit line to a fourth voltage,
wherein when the third transistor is turned on, the one end of the current path in the first transistor and the one end of the current path in the fourth transistor are electrically connected to the detector.

5. The device according to claim 1, further comprising:
a memory cell array including a plurality of NAND strings each comprising a plurality memory cells connected in series;
a voltage generator configured to supply, during reading of the data, a fifth voltage to the source while supplying a sum of a sixth voltage and the fifth voltage to gates of the first transistor and the second transistor;
wherein each of bit lines is connected to the corresponding NAND string, and
a sense amplifier further includes a third transistor, the first transistor and the second transistor, the third transistor and the first transistor connected in series, the first and third transistors charging the bit line to a fifth voltage when the data is to be read from the memory cell.

6. The device according to claim 5, wherein the voltage generator includes a voltage switching circuit configured to supply the sum of the sixth voltage and the fifth voltage to the first transistor and the third transistor.

7. The device according to claim 6, wherein
the voltage switching circuit further comprises:
a current source configured to supply a first current to a first node; and
a group of transistors forming a mirror circuit together with the third transistor and passing the first current to a second node,
wherein a number of the transistors in the group forming the mirror circuit corresponds to a channel length between the first transistor and the third transistor,
the voltage switching circuit supplies the gate of the first transistor with a voltage substantially equal to the sum plus a seventh voltage during precharging of the bit line before the data is read.

8. The device according to claim 7, further comprising:
a controller configured to vary the number of the transistors forming the mirror circuit, and the transistors in the group passing the first current to the second node,
wherein after the precharging and when the data is read, the controller switches the value of the group of the transistors from a first number to a second number smaller than the first number.

9. The device according to claim 8, wherein the second node includes a third node and a fourth node, and
the group of the transistors forming the mirror circuit includes a first group of transistors passing a current present at the first node to the second node and a second group of transistors passing a current present at the first node to the fourth node, and
the number of the transistors in the group is switched by turning on or off switches connected to the third node and the fourth node, respectively.

10. The device according to claim 1, further comprising:
a source line driver including a fifth node connected to a source; the source line driver includes a transistor, one end of the current path in the transistor being connected the fifth node and the other end of the current path in the transistor being grounded,
a voltage controller configured to supply a voltage to the fifth node and turn on the transistor to control charge and discharge of the fifth node,
wherein the voltage controller includes:
a voltage booster configured to boost, during a read operation, a voltage of the source via the fifth node, and to detect when the potential of the well is higher than a first value, to stop boosting the potentials of the source and the well; and a pull-down driver configured to detect the potential of the source and to controllably discharge the potential of the fifth node when the potential of the source exceeds a second value.

11. The device according to claim 10, further comprising:
a first interconnect configured to connect a sixth node of the source of the first block to the fifth node and having a first length; and
a second interconnect configured to connect a seventh node of the source of the second block to the fifth node and having a second length which is a part of the first interconnect and which is shorter than the first length,
wherein the pull-down driver detects the potential of the sixth node.

12. The device according to claim 11, wherein the source line driver comprises a first switch configured to discharge the potential of the fifth node, and
the pull-down driver starts discharging the potential of the fifth node via the first switch, while the voltage booster outputting.

13. The device according to claim 11, further comprising:
a selector comprising a first mode and a second mode and enabling a detection target node to be selected depending on one of the first mode and the second mode,
wherein in the first mode in which the well is charged, the selector makes such a selection as to detect the potential of the well and outputs a result of the detection to the voltage boost section, and
in the second mode in which the well is set to a ground potential and the fifth node is charged, the selector makes such a selection as to detect a potential of the seventh node and outputs a result of the detection to the voltage booster.

14. The device according to claim 10, further comprising:
bit lines each corresponding to one of the NAND strings and reading the data held by the memory cell;
a driver controllably turning on and off the bit line; and
an accelerator controlling a rising edge of a potential of the bit line,
wherein the accelerator generates a second voltage higher than a first voltage with respect to the potential of the bit line which rises to the first voltage, and outputs the second voltage to the driver.

* * * * *